(12) United States Patent
Chong et al.

(10) Patent No.: US 11,837,642 B2
(45) Date of Patent: Dec. 5, 2023

(54) SEMICONDUCTOR DEVICE AND METHOD OF FABRICATING THE SAME

(71) Applicant: Samsung Electronics Co., Ltd., Suwon-si (KR)

(72) Inventors: Soogine Chong, Seoul (KR); Jongseob Kim, Seoul (KR); Joonyong Kim, Seoul (KR); Younghwan Park, Seongnam-si (KR); Junhyuk Park, Pohang-si (KR); Dongchul Shin, Suwon-si (KR); Jaejoon Oh, Seongnam-si (KR); Sunkyu Hwang, Seoul (KR); Injun Hwang, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 171 days.

(21) Appl. No.: 17/016,877

(22) Filed: Sep. 10, 2020

(65) Prior Publication Data

US 2021/0184010 A1 Jun. 17, 2021

(30) Foreign Application Priority Data

Dec. 12, 2019 (KR) .................. 10-2019-0165997

(51) Int. Cl.
*H01L 29/423* (2006.01)
*H01L 21/02* (2006.01)
(Continued)

(52) U.S. Cl.
CPC ...... *H01L 29/42316* (2013.01); *H01L 21/022* (2013.01); *H01L 21/0217* (2013.01);
(Continued)

(58) Field of Classification Search
CPC ............ H01L 29/42316; H01L 29/404; H01L 29/7786; H01L 29/41766; H01L 29/402; H01L 29/7787; H01L 29/778
See application file for complete search history.

(56) References Cited

U.S. PATENT DOCUMENTS

| | | | |
|---|---|---|---|
| 6,639,255 B2 | 10/2003 | Inoue et al. | |
| 6,649,287 B2 | 11/2003 | Weeks, Jr. et al. | |

(Continued)

FOREIGN PATENT DOCUMENTS

| | | |
|---|---|---|
| CN | 106684140 A | 5/2017 |
| CN | 108447907 A | 8/2018 |

(Continued)

OTHER PUBLICATIONS

Partial European Search Report dated May 12, 2021, issued in corresponding European Patent Application No. 20210064.0.

(Continued)

*Primary Examiner* — Mohammed R Alam
(74) *Attorney, Agent, or Firm* — Harness, Dickey & Pierce, P.L.C.

(57) ABSTRACT

A semiconductor device includes a channel layer including a channel; a channel supply layer on the channel layer; a channel separation pattern on the channel supply layer; a gate electrode pattern on the channel separation pattern; and an electric-field relaxation pattern protruding from a first lateral surface of the gate electrode pattern in a first direction parallel with an upper surface of the channel layer. An interface between the channel layer and the channel supply layer is adjacent to channel. A size of the gate electrode pattern in the first direction is different from a size of the channel separation pattern in the first direction. The gate electrode pattern and the electric-field relaxation pattern form a single structure.

35 Claims, 27 Drawing Sheets

(51) Int. Cl.
*H01L 21/285* (2006.01)
*H01L 21/765* (2006.01)
*H01L 23/31* (2006.01)
*H01L 29/20* (2006.01)
*H01L 29/205* (2006.01)
*H01L 29/40* (2006.01)
*H01L 29/66* (2006.01)
*H01L 29/778* (2006.01)

(52) U.S. Cl.
CPC .. *H01L 21/02164* (2013.01); *H01L 21/02178* (2013.01); *H01L 21/28587* (2013.01); *H01L 21/765* (2013.01); *H01L 23/3171* (2013.01); *H01L 23/3192* (2013.01); *H01L 29/2003* (2013.01); *H01L 29/205* (2013.01); *H01L 29/404* (2013.01); *H01L 29/66462* (2013.01); *H01L 29/7786* (2013.01)

(56) References Cited

U.S. PATENT DOCUMENTS

| | | |
|---|---|---|
| 6,933,544 B2 | 8/2005 | Saito et al. |
| 7,518,154 B2 | 4/2009 | Otsuka et al. |
| 7,566,916 B2 | 7/2009 | Hussain et al. |
| 7,948,220 B2 | 5/2011 | Bahramian |
| 8,193,562 B2 | 6/2012 | Suh et al. |
| 8,410,525 B2 | 4/2013 | Sato |
| 8,703,623 B2 | 4/2014 | Chung et al. |
| 8,796,737 B2 | 8/2014 | Hwang et al. |
| 8,803,565 B2 | 8/2014 | Kim et al. |
| 8,866,190 B2 | 10/2014 | Briere |
| 8,921,890 B2 | 12/2014 | Choi et al. |
| 9,076,850 B2 | 7/2015 | Hwang et al. |
| 9,117,890 B2 | 8/2015 | Kim et al. |
| 9,508,822 B2 | 11/2016 | Oka et al. |
| 9,543,391 B2 | 1/2017 | Hwang et al. |
| 9,577,084 B2 | 2/2017 | Hikita et al. |
| 9,660,048 B2 | 5/2017 | Hwang et al. |
| 9,748,347 B2 | 8/2017 | Cao et al. |
| 10,964,788 B1* | 3/2021 | Chen ................. H01L 29/66462 |
| 11,069,802 B2 | 7/2021 | Hwang et al. |
| 11,387,358 B2 | 7/2022 | Park et al. |
| 11,581,269 B2 | 2/2023 | Park et al. |
| 2014/0264450 A1* | 9/2014 | Chyi ................... H01L 29/7786 257/194 |
| 2016/0268410 A1 | 9/2016 | Onizawa et al. |
| 2017/0133496 A1* | 5/2017 | Tsai ................ H01L 21/823456 |
| 2018/0026124 A1* | 1/2018 | Shimizu ................ H01L 29/513 257/76 |
| 2019/0296139 A1* | 9/2019 | Wei ..................... H01L 29/2003 |
| 2023/0177920 A1 | 6/2023 | Sanford et al. |

FOREIGN PATENT DOCUMENTS

| | | |
|---|---|---|
| JP | 2008-258419 A | 10/2008 |
| JP | 2008-263140 A | 10/2008 |
| JP | 2016-171197 A | 9/2016 |

OTHER PUBLICATIONS

Chinese Office Action dated Aug. 25, 2023 for corresponding Chinese Patent Application No. 202011107929.6 and English translation thereof.

* cited by examiner

SEMICONDUCTOR DEVICE AND METHOD OF FABRICATING THE SAME

CROSS-REFERENCE TO RELATED APPLICATION

This application claims the benefit of Korean Patent Application No. 10-2019-0165997, filed on Dec. 12, 2019, in the Korean Intellectual Property Office, the disclosure of which is incorporated herein in its entirety by reference.

BACKGROUND

1. Field

The present disclosure relates to semiconductor devices and methods of fabricating the semiconductor devices.

2. Description of Related Art

High-electron-mobility transistors (HEMTs) are power semiconductor devices. HEMTs include a heterojunction structure in which semiconductor material layers having different bandgaps are adjacent to each other. As materials having different bandgaps are formed in a heterojunction structure, a 2-dimensional electron gas (2DEG) layer may be induced in a semiconductor material layer having a relatively small bandgap, and thus properties such as the velocity of electrons may be improved.

SUMMARY

Provided are semiconductor devices having improved electrical characteristics.

Provided are methods of fabricating semiconductor devices having improved electrical characteristics.

Provided are methods of fabricating semiconductor devices with high process efficiency.

However, the present disclosure is not limited thereto.

Additional aspects will be set forth in part in the description which follows and, in part, will be apparent from the description, or may be learned by practice of the presented embodiments of the disclosure.

According to an embodiment, a semiconductor device includes: a channel layer including a channel; a channel supply layer on the channel layer; a channel separation pattern on the channel supply layer; a gate electrode pattern on the channel separation pattern; and an electric-field relaxation pattern protruding from a first lateral surface of the gate electrode pattern in a first direction parallel with an upper surface of the channel layer. An interface between the channel layer and the channel supply layer is adjacent to the channel. A size of the gate electrode pattern in the first direction is different from a size of the channel separation pattern in the first direction. The gate electrode pattern and the electric-field relaxation pattern form a single structure.

In some embodiments, the size of the gate electrode pattern in the first direction may be less than the size of the channel separation pattern in the first direction.

In some embodiments, the gate electrode pattern may expose a first upper surface of the channel separation pattern, and the first upper surface of the channel separation pattern may face a bottom surface of the electric-field relaxation pattern.

In some embodiments, a size of the bottom surface of the electric-field relaxation pattern in the first direction may be greater than a size of the first upper surface of the channel separation pattern in the first direction.

In some embodiments, the gate electrode pattern may expose a second upper surface of the channel separation pattern, the first upper surface and the second upper surface of the channel separation pattern may be apart from each other in the first direction, and a size of the first upper surface of the channel separation pattern in the first direction may be different from a size of the second upper surface of the channel separation pattern in the first direction.

In some embodiments, the semiconductor device may further include a first passivation film between the electric-field relaxation pattern and the channel supply layer. The channel separation pattern may be between the first passivation film and the channel supply layer, and the gate electrode pattern may pass through the first passivation film and may be in direct contact with the channel separation pattern.

In some embodiments, the semiconductor device may further include a first passivation pattern between the first passivation film and the channel separation pattern. An insulating material of the first passivation film may be different than an insulating material of the first passivation pattern.

In some embodiments, the first passivation film may include a nitride, and the first passivation pattern may include an oxide.

In some embodiments, the first passivation pattern may be on the first lateral surface of the gate electrode pattern.

In some embodiments, the semiconductor device may further include a second passivation pattern on a second lateral surface of the gate electrode pattern. The second lateral surface of the gate electrode pattern may be opposite the first lateral surface of the gate electrode pattern. The second passivation pattern may be between the first passivation film and the channel separation pattern.

In some embodiments, a lateral surface of the first passivation pattern and a lateral surface of the channel separation pattern may be coplanar and immediately adjacent to each other. A lateral surface of the second passivation pattern and an other lateral surface of the channel separation pattern may be coplanar and may be immediately adjacent to each other.

In some embodiments, a semiconductor device may further include a drain electrode pattern on the channel layer and apart from the gate electrode pattern in the first direction; a source electrode pattern at a side of the gate electrode pattern, the side of the gate electrode pattern being opposite the drain electrode pattern; and a second auxiliary drain electrode pattern protruding from a lateral surface of the drain electrode pattern, wherein the second auxiliary drain electrode pattern may be provided on the first passivation film.

In some embodiments, the semiconductor device may further include: a second passivation film between the first passivation film and the electric-field relaxation pattern; and an additional electric-field relaxation pattern between the second passivation film and the first passivation film. The additional electric-field relaxation pattern may be between the gate electrode pattern and the second auxiliary drain electrode pattern, and the gate electrode pattern may pass through the second passivation film and the first passivation film and the gate electrode pattern may directly contact the channel separation pattern.

In some embodiments, the semiconductor device may further include: a third passivation film on the gate electrode pattern, the electric-field relaxation pattern, and the second passivation film; an additional electric-field relaxation film on the third passivation film; and a first auxiliary drain electrode pattern on the third passivation film. The additional electric-field relaxation film may be electrically connected to the source electrode pattern, the first auxiliary drain electrode pattern may be electrically connected to the drain electrode pattern, and the additional electric-field relaxation film and the first auxiliary drain electrode pattern may be apart from each other.

In some embodiments, the semiconductor device may further include: a first passivation pattern between the first passivation film and the channel separation pattern; and a second passivation pattern on a side of the gate electrode pattern, the side of the gate electrode pattern being opposite the first passivation pattern, wherein the first passivation film and the first passivation pattern may include different insulating materials from each other, respectively, and the first passivation pattern and the second passivation pattern may include the same material.

In some embodiments, the first passivation film may include a nitride, and the first passivation pattern and the second passivation pattern may include an oxide.

In some embodiments, the semiconductor device may further include: a second passivation film on the first passivation film and the gate electrode pattern; a drain electrode pattern apart from the gate electrode pattern in the first direction; a source electrode pattern at a side of the gate electrode pattern, the side of the gate electrode pattern being opposite the drain electrode pattern; an additional electric-field relaxation film on the second passivation film; and a first auxiliary drain electrode pattern on the drain electrode pattern. The electric-field relaxation pattern may be between the second passivation film and the first passivation film. The additional electric-field relaxation film may overlap the source electrode pattern in a second direction perpendicular to the upper surface of the channel layer. The additional electric-field relaxation film may be electrically connected to the source electrode pattern. The first auxiliary drain electrode pattern may be electrically connected to the drain electrode pattern.

In some embodiments, the semiconductor device may further include a protruding pattern that protrudes from a second lateral surface of the gate electrode pattern, the second lateral surface of the gate electrode pattern being opposite the first lateral surface of the gate electrode pattern, wherein the protruding pattern and the gate electrode pattern may form a single structure.

In some embodiments, a size of the electric-field relaxation pattern in the first direction may be greater than a size of the protruding pattern in the first direction.

In some embodiments, the size of the channel separation pattern in the first direction may decrease in a direction away from the channel supply layer.

The size of the gate electrode pattern in the first direction may increase in a direction away from the channel supply layer.

In some embodiments, the semiconductor device may further include: a first passivation film between the electric-field relaxation pattern and the channel supply layer; a drain electrode pattern being apart from the gate electrode pattern in the first direction; and a source electrode pattern at a side of the gate electrode pattern. The side of the gate electrode pattern may be opposite the drain electrode pattern. The source electrode pattern and the drain electrode pattern may pass through the first passivation film and the channel supply layer and may contact the channel.

In some embodiments, the channel layer may include GaN; the channel separation pattern may include a group III-V nitride semiconductor; and the channel supply layer may include a nitride including at least of aluminum (Al), gallium (Ga), indium (In), and boron (B).

In some embodiments, the channel separation pattern may be p-type and may include at least one of GaN, AlGaN, InN, AlInN, InGaN, and AlInGaN. The channel supply layer may include at least one of AlGaN, AlInN, InGaN, AlN, and AlInGaN.

According to an embodiment, a method of fabricating a semiconductor device includes: sequentially forming a channel supply layer and a channel separation pattern on a channel layer; forming a first passivation film on the channel supply layer and the channel separation pattern; forming an opening in the first passivation film to expose an upper surface of the channel separation pattern through the opening; and forming a conductive material pattern on the channel separation pattern. The channel layer may include a channel adjacent to an interface between the channel layer and the channel supply layer, and the conductive material pattern extends outward from inside the opening.

In some embodiments, the opening may expose a portion of the upper surface of the channel separation pattern.

In some embodiments, a distance between the opening and a lateral surface of the channel separation pattern may be different from a distance between the opening and an other lateral surface of the channel separation pattern.

In some embodiments, a width of the opening may decrease in a direction toward the channel separation pattern, and the width of the opening may be a size of the opening in a first direction parallel with an upper surface of the channel layer.

In some embodiments, the forming the conductive material pattern may include: forming a conductive material film that extends along an upper surface of the first passivation film and fills the opening; and patterning the conductive material film. The conductive material pattern may include a gate electrode pattern and an electric-field relaxation pattern. The gate electrode pattern may overlap the opening in a second direction perpendicular to an upper surface of the channel layer. The electric-field relaxation pattern may protrude from a first lateral surface of the gate electrode pattern.

In some embodiments, the conductive material pattern may further include a protruding pattern which protrudes from a second lateral surface of the gate electrode pattern, the patterning the conductive material film may patterning the electric-field relaxation pattern and the protruding pattern to have different lengths, and a length of the electric-field relaxation pattern and a length the protruding pattern may respectively be sizes of the electric-field relaxation pattern and the protruding pattern in a first direction parallel with the upper surface of the channel layer.

In some embodiments, the method may further include: forming a second passivation film on the first passivation film and the conductive material pattern; forming a source electrode pattern and a drain electrode pattern that pass through the second passivation film, the first passivation film, and the channel supply layer; and forming a second auxiliary drain electrode pattern that protrudes from a lateral surface of the drain electrode pattern between the first passivation film and the second passivation film. The source electrode pattern and the drain electrode pattern may be apart from each other with the conductive material pattern therebetween.

In some embodiments, the method may further include forming an additional electric-field relaxation film on the second passivation film, wherein the additional electric-field relaxation film may be electrically connected to the source electrode pattern.

In some embodiments, the forming the additional electric-field relaxation film may include: forming a preliminary additional electric-field relaxation film that extends from the source electrode pattern to the drain electrode pattern along an upper surface of the second passivation film; and patterning the preliminary additional electric-field relaxation film to expose the upper surface of the second passivation film between the conductive material pattern and the drain electrode pattern.

In some embodiments, a distance between the additional electric-field relaxation film and the drain electrode pattern may be less than a distance between the conductive material pattern and the drain electrode pattern.

In some embodiments, the patterning the preliminary additional electric-field relaxation film may include forming the second auxiliary drain electrode pattern on the drain electrode pattern.

In some embodiments, the method may further include: forming a source electrode pattern and a drain electrode pattern that pass through the first passivation film and the channel supply layer; forming an additional electric-field relaxation pattern on the first passivation film; forming a second auxiliary drain electrode pattern that protrudes from a lateral surface of the drain electrode pattern onto the first passivation film; and forming a second passivation film on the additional electric-field relaxation pattern, the second auxiliary drain electrode pattern, and the first passivation film, wherein the source electrode pattern and the drain electrode pattern may be apart from each other with the channel separation pattern therebetween, and the opening may pass through the second passivation film and the first passivation film and may expose the upper surface of the channel separation pattern.

In some embodiments, the method may further include: forming a third passivation film on the second passivation film and the conductive material pattern; and forming an additional electric-field relaxation film and a first auxiliary drain electrode pattern on the third passivation film. The forming the additional electric-field relaxation film and the first auxiliary drain electrode pattern may include: forming a preliminary additional electric-field relaxation film that extends from the source electrode pattern to the drain electrode pattern along an upper surface of the third passivation film; and patterning the preliminary additional electric-field relaxation film to expose the upper surface of the third passivation film between the conductive material pattern and the drain electrode pattern. The additional electric-field relaxation film may be electrically connected to the source electrode pattern, and the first auxiliary drain electrode pattern may be electrically connected to the drain electrode pattern.

In some embodiments, the method may further include forming a preliminary passivation pattern on the channel separation pattern prior to the forming of the first passivation film, wherein the preliminary passivation pattern may have an etch selectivity with respect to the channel separation pattern, and the first passivation film may have an etch selectivity with respect to the preliminary passivation pattern.

In some embodiments, the forming the opening may include: performing a first selective etching process on the first passivation film to expose an upper surface of the passivation pattern; and performing a second selective etching process to expose the upper surface of the channel separation pattern.

In some embodiments, the first passivation film may include a nitride, and the preliminary passivation pattern may include an oxide.

In some embodiments, the channel layer may include GaN; the channel separation pattern may include a group III-V nitride semiconductor; and the channel supply layer may include a nitride including at least of aluminum (Al), gallium (Ga), indium (In), and boron (B).

In some embodiments, the channel separation pattern may be p-type and may include at least one of GaN, AlGaN, InN, AlInN, InGaN, and AlInGaN. The channel supply layer may include at least one of AlGaN, AlInN, InGaN, AlN, and AlInGaN.

According to another embodiment, a semiconductor device includes: a semiconductor layer, the semiconductor layer including a 2-dimensional electron gas (2DEG) layer, the 2DEG layer including a depletion region; a p-type semiconductor pattern on the semiconductor layer and over the depletion region; a conductive material pattern on the p-type semiconductor pattern; and a source electrode pattern and a drain electrode pattern on the semiconductor layer. The source electrode pattern and the drain electrode pattern are apart from each other in a direction parallel with an upper surface of the semiconductor layer with the conductive material pattern therebetween. A width of a lower portion of the conductive material pattern is different from a width of the p-type semiconductor pattern. A width of an upper portion of the conductive material pattern is greater than the width of the lower portion of the conductive material pattern.

In some embodiments, the width of the lower portion of the conductive material pattern may be less than the width of the p-type semiconductor pattern.

In some embodiments, a distance between the upper portion of the conductive material pattern and the drain electrode pattern may be less than a distance between the lower portion of the conductive material pattern and the drain electrode pattern.

In some embodiments, a distance between the upper portion of the conductive material pattern and the drain electrode pattern may be less than a distance between the p-type semiconductor pattern and the drain electrode pattern.

In some embodiments, the width of the upper portion of the conductive material pattern may be greater than the width of the p-type semiconductor pattern.

In some embodiments, the semiconductor device may further include an additional electric-field relaxation film provided on the conductive material pattern, wherein a distance between the additional electric-field relaxation film and the drain electrode pattern may be less than a distance between the upper portion of the conductive material pattern and the drain electrode pattern.

In some embodiments, the semiconductor device may further include: an auxiliary drain electrode pattern protruding from a lateral surface of the drain electrode pattern toward the conductive material pattern; and an additional electric-field relaxation pattern between the conductive material pattern and the auxiliary drain electrode pattern.

In some embodiments, a distance between the upper portion of the conductive material pattern and the source electrode pattern may be less than a distance between the lower portion of the conductive material pattern and the source electrode pattern.

In some embodiments, the upper portion of the conductive material pattern may include an electric-field relaxation pattern and a protruding pattern. The electric-field relaxation pattern may protrude from a first lateral surface of the upper portion of the conductive material pattern toward the drain electrode pattern. The protruding pattern may protrude from a second lateral surface of the upper portion of the conductive material pattern toward the source electrode pattern. A width of the electric-field relaxation pattern may be greater than a width of the protruding pattern.

In some embodiments, the semiconductor device may further include a first passivation pattern and a second passivation pattern, which are respectively provided on a first upper surface and a second upper surface of the p-type semiconductor pattern. The conductive material pattern may expose the first and second upper surfaces of the p-type semiconductor pattern. The first passivation pattern and the second passivation pattern may be apart from each other with the conductive material pattern therebetween.

In some embodiments, the semiconductor may include GaN and the p-type semiconductor pattern may include a group III-V nitride semiconductor.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
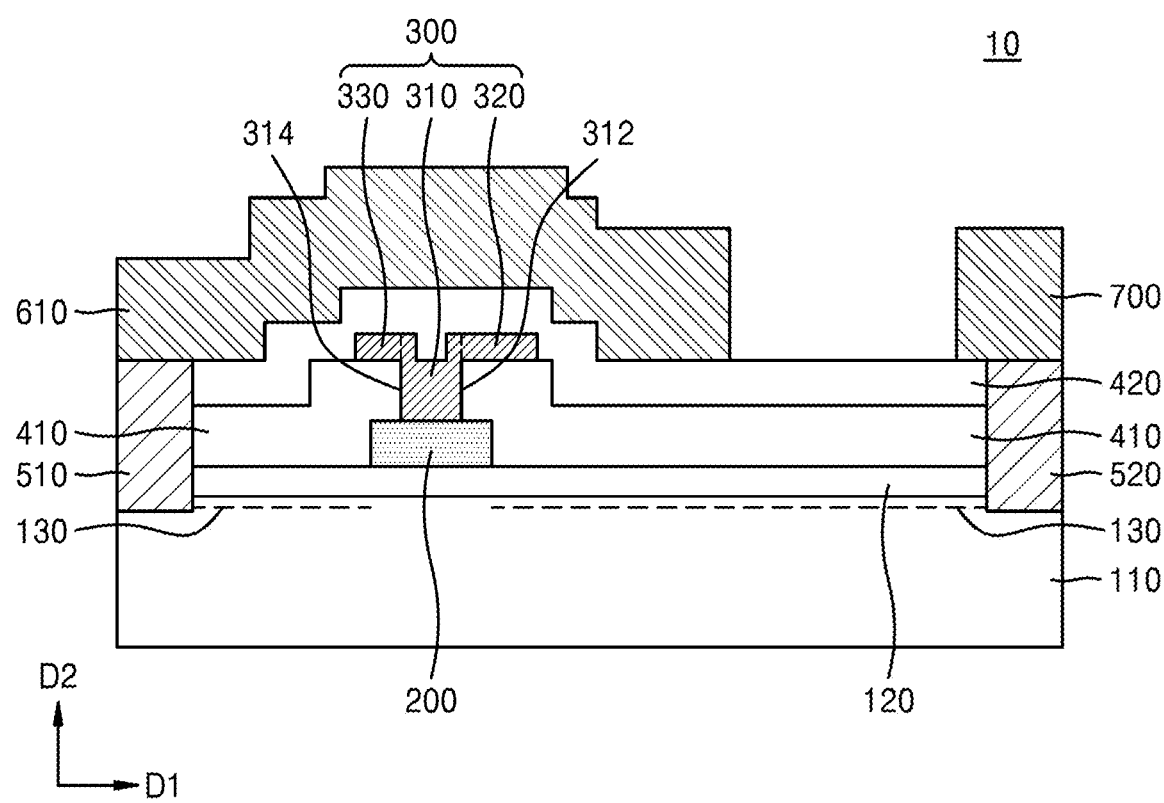
FIGS. 1 and 24 are cross-sectional views illustrating semiconductor devices according to example embodiments.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

In the following description, when an element is referred to as being "above" or "on" another element, it may be directly on the other element while making contact with the other element or may be above the other element without making contact with the other element.

The terms of a singular form may include plural forms unless otherwise mentioned. It will be further understood that the terms "comprises" and/or "comprising" used herein specify the presence of stated features or elements, but do not preclude the presence or addition of one or more other features or elements.

In the present disclosure, terms such as "unit" and/or "module" are used to denote a unit having at least one function or operation and implemented with hardware, software, or a combination of hardware and software.

FIG. 1 is a cross-sectional view illustrating a semiconductor device 10 according to example embodiments.

Referring to FIG. 1, the semiconductor device 10 may be provided. The semiconductor device 10 may be a power semiconductor device. For example, the semiconductor device 10 may be a high-electron-mobility transistor (HEMT). The semiconductor device 10 may include a channel layer 110, a channel supply layer 120, a channel separation pattern 200, a first passivation film 410, a conductive material pattern 300, a second passivation film 420, a source electrode pattern 510, a drain electrode pattern 520, an additional electric-field relaxation film 610, and a first auxiliary drain electrode pattern 700. The channel layer 110 may include a group III-V compound semiconductor. For example, the channel layer 110 may include GaN.

The channel supply layer 120 may be a semiconductor layer different from the channel layer 110. The channel supply layer 120 may form a 2-dimensional electron gas (2DEG) layer 130 in the channel layer 110. For example, the 2DEG layer 130 may be a channel of the semiconductor device 10. The 2DEG layer 130 may be formed in the channel layer 110 adjacent to the interface between the channel supply layer 120 and the channel layer 110. For example, the 2DEG layer 130 may extend in a first direction D1 parallel to an upper surface of the channel layer 110. The channel supply layer 120 may be different from the channel layer 110 in at least one of polarization characteristics, energy bandgap, and lattice constant. The channel supply layer 120 may include at least one material selected from nitrides including at least one selected from the group consisting of aluminum (Al), gallium (Ga), indium (In), and boron (B). For example, the channel supply layer 120 may include at least one selected from the group consisting of AlGaN, AlInN, InGaN, AlN, and AlInGaN. The channel supply layer 120 may have a single-layer structure or a multi-layer structure.

The channel separation pattern 200 may be provided on the channel supply layer 120. The channel separation pattern 200 may increase the energy band of a portion of the channel supply layer 120 which is below the channel separation pattern 200. A depletion region (not shown) may be formed in the 2DEG layer 130 under the channel separation pattern 200. The 2DEG layer 130 may be broken in a region adjacent to the channel separation pattern 200 by the depletion region. Therefore, the semiconductor device 10 may have a normally-off characteristic.

The channel separation pattern 200 may include a group III-V nitride semiconductor. For example, the channel separation pattern 200 may include at least one selected from the group consisting of GaN, AlGaN, InN, AlInN, InGaN, and AlInGaN. The channel separation pattern 200 may be a p-type semiconductor layer or a layer doped with a p-type dopant. For example, the channel separation pattern 200 may be doped with a p-type dopant such as magnesium (Mg). For example, the channel separation pattern 200 may be a p-type GaN layer or a p-type AlGaN layer.

The first passivation film 410 may be provided on the channel supply layer 120 and the channel separation pattern 200. The first passivation film 410 may extend along the channel supply layer 120. The first passivation film 410 may cover the channel separation pattern 200. The first passivation film 410 may include an opening (not shown) through which an upper surface of the channel separation pattern 200 is exposed. For example, a portion of the upper surface of the channel separation pattern 200 may be exposed through the opening. The first passivation film 410 may include an insulating material. For example, the first passivation film 410 may include an oxide, a nitride, or a combination thereof. For example, the first passivation film 410 may include at least one selected from the group consisting of $SiO_2$, $Al_2O_3$, and $Si_xN_y$.

The conductive material pattern 300 may be provided on the channel separation pattern 200. The conductive material pattern 300 may include an electrically conductive material. For example, the conductive material pattern 300 may include a metal. The conductive material pattern 300 may include a gate electrode pattern 310, an electric-field relaxation pattern 320, and a protruding pattern 330.

The gate electrode pattern 310 may overlap the channel separation pattern 200 in a second direction D2 perpendicular to the upper surface of the channel layer 110. For example, in the second direction D2, the gate electrode pattern 310 may overlap the portion of the upper surface of the channel separation pattern 200 which is exposed through the opening. The gate electrode pattern 310 may be provided in the opening and may extend outward from the opening. For example, the gate electrode pattern 310 may extend in the second direction D2. The width of the gate electrode pattern 310 may be different from the width of the channel separation pattern 200. For example, the width of the gate electrode pattern 310 may be less than the width of the channel separation pattern 200. The width of the gate electrode pattern 310 may be a size of the gate electrode pattern 310 in the first direction D1. The width of the channel separation pattern 200 may be a size of the channel separation pattern 200 in the first direction D1. When the width of the gate electrode pattern 310 is less than the width of the channel separation pattern 200, the gate electrode pattern 310 and the channel separation pattern 200 may be referred to as a stepped gate structure. Since the gate electrode pattern 310 has a width less than the width of the channel separation pattern 200, leakage current flowing along a lateral surface of the gate electrode pattern 310 and a lateral surface of the channel separation pattern 200 may be reduced, and concentration of an electric field on the lateral surface of the gate electrode pattern 310 may be limited and/or prevented.

The electric-field relaxation pattern 320 may protrude from a first lateral surface 312 of the gate electrode pattern 310. The first lateral surface 312 of the gate electrode pattern 310 may be a lateral surface of the gate electrode pattern 310 facing the drain electrode pattern 520. The electric-field relaxation pattern 320 may extend along an upper surface of the first passivation film 410. The electric-field relaxation pattern 320 may extend from the first lateral surface 312 of the gate electrode pattern 310 toward the drain electrode pattern 520. For example, the electric-field relaxation pattern 320 may extend in the first direction D1. In an example, the electric-field relaxation pattern 320 may further extend toward the drain electrode pattern 520 along the upper surface of the first passivation film 410. The electric-field relaxation pattern 320 may be closer to the drain electrode pattern 520 than the channel separation pattern 200 is to the drain electrode pattern 520. The distance between the electric-field relaxation pattern 320 and the drain electrode pattern 520 may be different from the distance between the channel separation pattern 200 and the drain electrode pattern 520. For example, the distance between the electric-field relaxation pattern 320 and the drain electrode pattern 520 may be less than the distance between the channel separation pattern 200 and the drain electrode pattern 520. The electric-field relaxation pattern 320 may mitigate the concentration of an electric field on the lateral surface of the channel separation pattern 200. The electric-field relaxation pattern 320 may overlap an upper portion of the gate electrode pattern 310 in the first direction D1. The electric-field relaxation pattern 320 may overlap the channel separation pattern 200 in the second direction D2. A bottom surface of the electric-field relaxation pattern 320 may face the upper surface of the channel separation pattern 200. The electric-field relaxation pattern 320 may form a single structure together with the gate electrode pattern 310. In other words, the electric-field relaxation pattern 320 and the gate electrode pattern 310 may be connected to each other without any interface therebetween.

The protruding pattern 330 may protrude from a second lateral surface 314 of the gate electrode pattern 310. The second lateral surface 314 of the gate electrode pattern 310 may be a lateral surface of the gate electrode pattern 310 facing the source electrode pattern 510. The protruding pattern 330 may extend along the upper surface of the first passivation film 410. For example, the protruding pattern 330 may extend in the first direction D1. In an example, the protruding pattern 330 may further extend toward the source electrode pattern 510 along the upper surface of the first passivation film 410. Although it is illustrated that the length of the protruding pattern 330 is less than the length of the electric-field relaxation pattern 320, this is a non-limiting example. In another example, the length of the protruding pattern 330 may be equal to or greater than the length of the electric-field relaxation pattern 320. The protruding pattern 330 may form a single structure together with the gate electrode pattern 310. In other words, the protruding pattern 330 and the gate electrode pattern 310 may be connected to each other without any interface therebetween. As a result, the gate electrode pattern 310, the electric-field relaxation pattern 320, and the protruding pattern 330 may form a single structure.

The second passivation film 420 may be provided on the first passivation film 410 and the conductive material pattern 300. The second passivation film 420 may extend along the upper surface of the first passivation film 410. The second passivation film 420 may cover the conductive material pattern 300. The second passivation film 420 may include an insulating material. For example, the second passivation film 420 may include an oxide, a nitride, or a combination thereof. For example, the second passivation film 420 may include at least one selected from the group consisting of $SiO_2$, $Al_2O_3$, and $Si_xN_y$.

Figure 24:
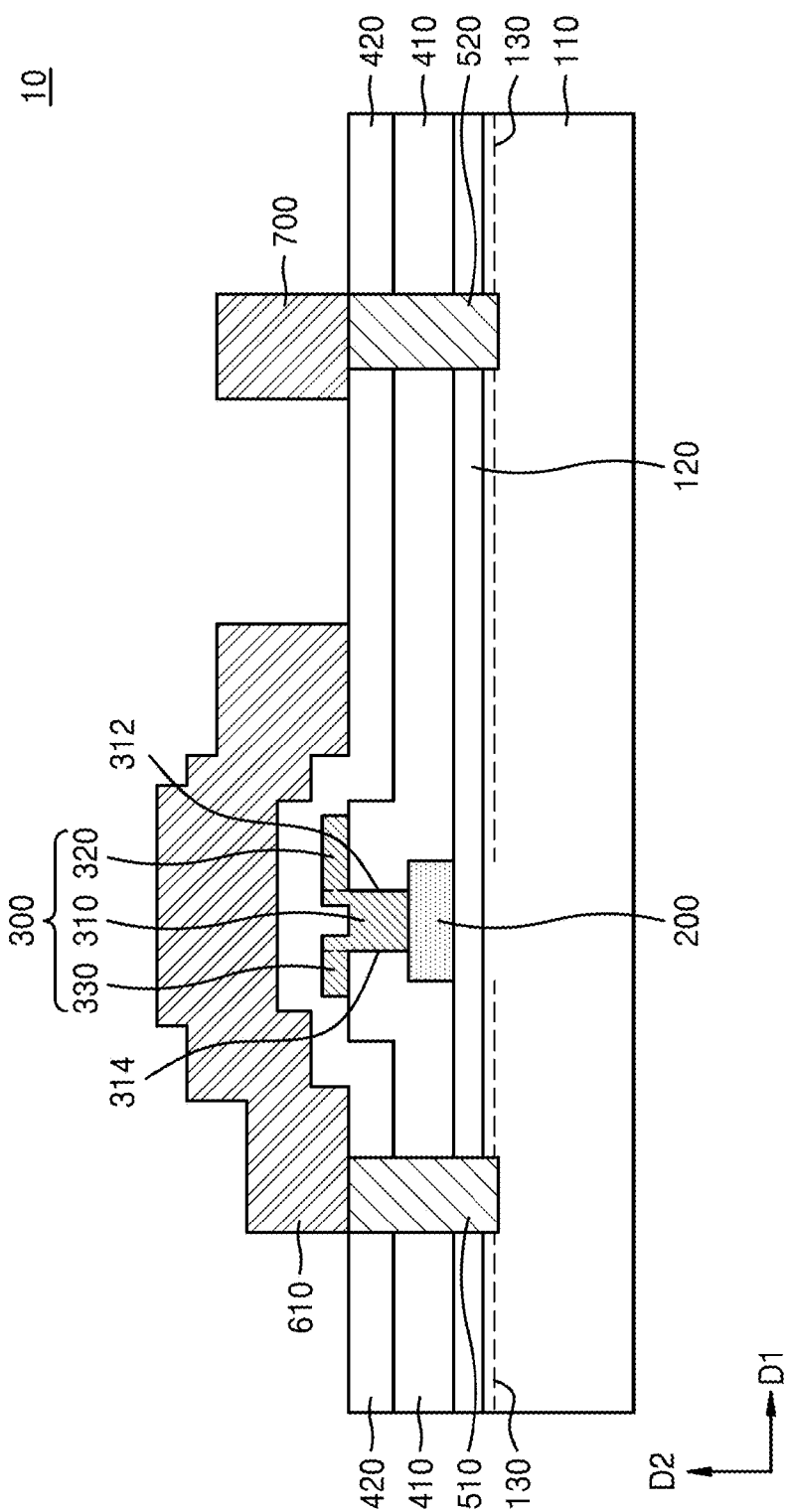

The source electrode pattern 510 and the drain electrode pattern 520 may be apart from each other with the gate electrode pattern 310 therebetween. The source electrode pattern 510 and the drain electrode pattern 520 may be apart from each other in the first direction D1. The source electrode pattern 510 and the drain electrode pattern 520 may pass through the second passivation film 420, the first passivation film 410, and the channel supply layer 120 (for example, as depicted in FIG. 24). The source electrode pattern 510 and the drain electrode pattern 520 may be electrically connected to the 2DEG layer 130. For example, the source electrode pattern 510 and the drain electrode pattern 520 may extend into the channel layer 110 and may directly make contact with the 2DEG layer 130. The source electrode pattern 510 and the drain electrode pattern 520 may make ohmic contact with the channel supply layer 120. In another example embodiment, an ohmic contact layer (not shown) may be provided between the source electrode pattern 510 and the channel layer 110 and between the drain electrode pattern 520 and the channel layer 110. The source electrode pattern 510 and the drain electrode pattern 520 may have a single-layer structure or a multi-layer structure. For example, the source electrode pattern 510 and the drain electrode pattern 520 may include at least one selected from the group consisting of titanium (Ti), aluminum (Al), nickel (Ni), and gold (Au).

The additional electric-field relaxation film 610 may be provided on the second passivation film 420. The additional electric-field relaxation film 610 may extend on the source electrode pattern 510 and along the second passivation film 420. The additional electric-field relaxation film 610 may be electrically connected to the source electrode pattern 510. For example, the additional electric-field relaxation film 610 may be in direct contact with the source electrode pattern 510. Therefore, the source electrode pattern 510 and the additional electric-field relaxation film 610 may have the same potential. The additional electric-field relaxation film 610 may overlap the conductive material pattern 300 and the channel separation pattern 200 in the second direction D2. The additional electric-field relaxation film 610 may be closer to the drain electrode pattern 520 than the electric-field relaxation pattern 320 is to the drain electrode pattern 520. The distance between the additional electric-field relaxation film 610 and the drain electrode pattern 520 may be less than the distance between the electric-field relaxation pattern 320 and the drain electrode pattern 520. The additional electric-field relaxation film 610 may include an electrically conductive material. For example, the additional electric-field relaxation film 610 may include a metal. The additional electric-field relaxation film 610 may limit and/or prevent the concentration of an electric field between the conductive material pattern 300 and the drain electrode pattern 520.

Figure 25:
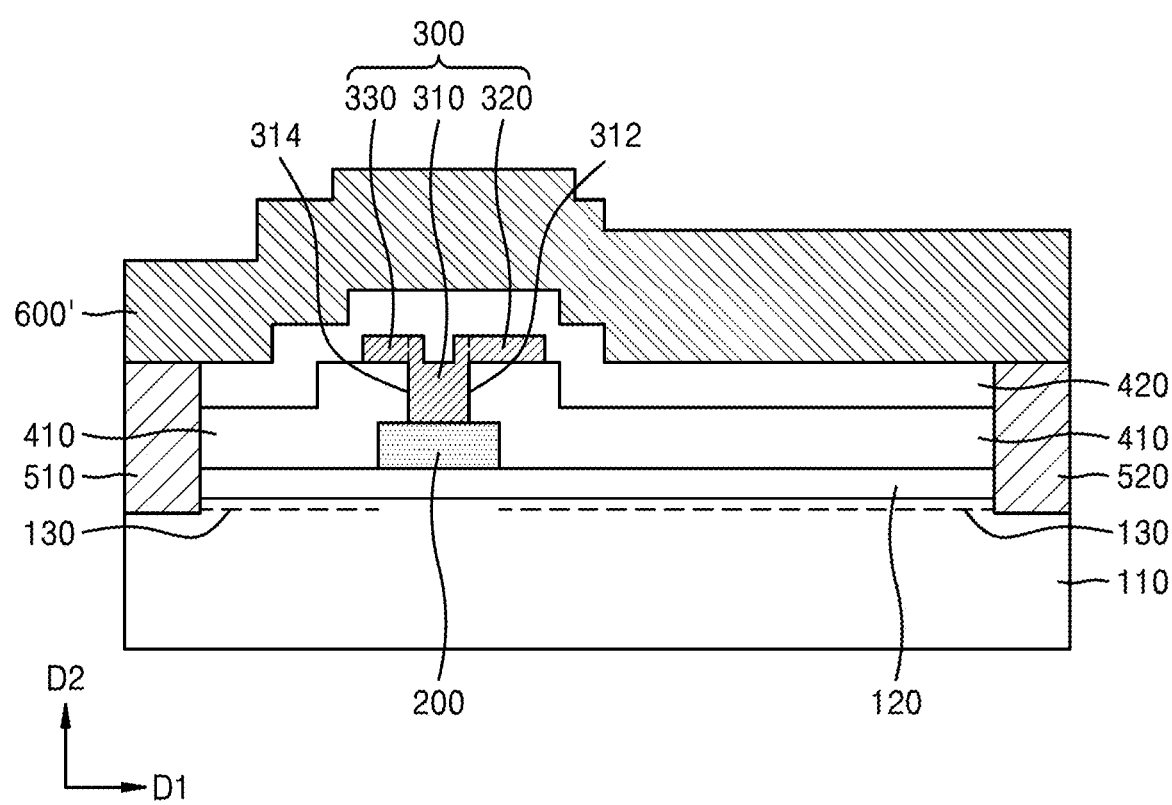
FIG. 25 is a cross-sectional view illustrating an operation of a method of fabricating the semiconductor device shown in FIG. 1 according to example embodiments.

The first auxiliary drain electrode pattern 700 may be provided on the drain electrode pattern 520. The first auxiliary drain electrode pattern 700 may extend onto the second passivation film 420. The first auxiliary drain electrode pattern 700 may be apart from the additional electric-field relaxation film 610. The first auxiliary drain electrode pattern 700 may be electrically connected to the drain electrode pattern 520. For example, the first auxiliary drain electrode pattern 700 may be in direct contact with the drain electrode pattern 520. The first auxiliary drain electrode pattern 700 may include an electrically conductive material. For example, the first auxiliary drain electrode pattern 700 may include a metal. In some embodiments, as depicted in FIG. 25, the additional electric-field relaxation film 610 and drain electrode pattern 700 of FIG. 1 may be formed by forming a preliminary additional electric-field relaxation film 600', which extends from the source electrode pattern 510 to the drain electrode pattern 520 along an upper surface of the second passivation film 420; and patterning the preliminary additional electric-field relaxation film 600' to expose the upper surface of the second passivation film 420 between the conductive material pattern 300 and the drain electrode pattern 520.

In the present embodiments, the gate electrode pattern 310 may have a width different from that of the channel separation pattern 200. Therefore, leakage current flowing through the lateral surfaces of the gate electrode pattern 310 and the channel separation pattern 200 may be reduced, or it may be possible to limit and/or prevent the leakage current. In the present embodiments, the electric-field relaxation pattern 320, the additional electric-field relaxation film 610, and the first auxiliary drain electrode pattern 700 may reduce or prevent the concentration of an electric field between the gate electrode pattern 310 and the drain electrode pattern 520. According to the present embodiments, the electrical characteristics of the semiconductor device 10 may be improved.

Figure 2:
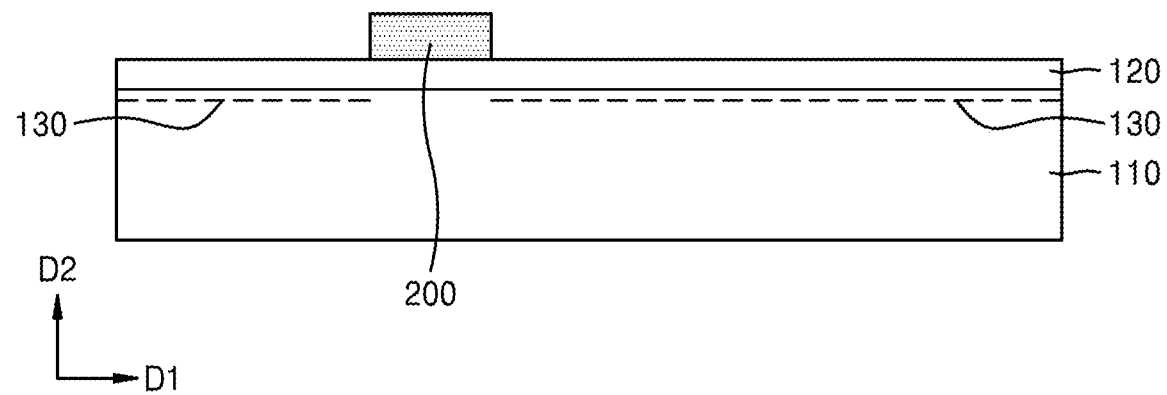
FIG. 2 is a cross-sectional view illustrating a method of fabricating the semiconductor device shown in FIG. 1.
Figure 3:
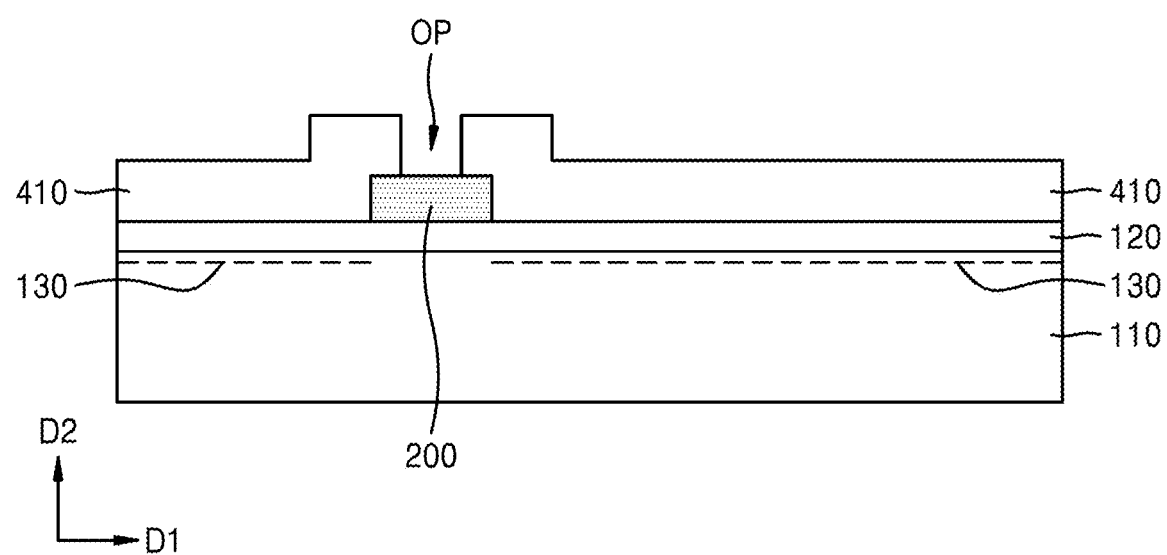
FIG. 3 is a cross-sectional view illustrating the method of fabricating the semiconductor device shown in FIG. 1.
Figure 4:
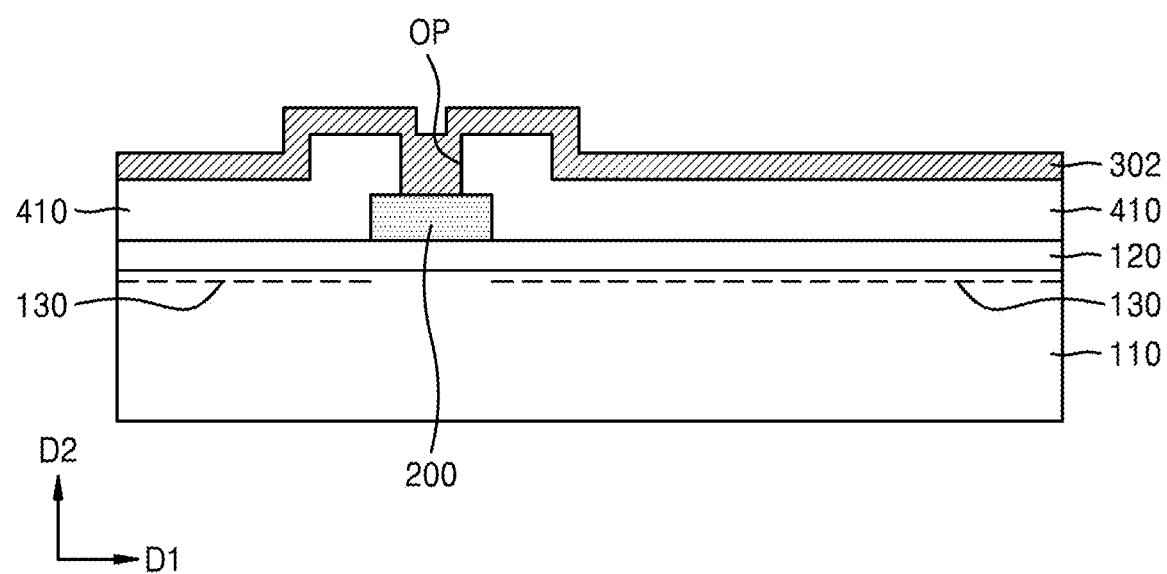
FIG. 4 is a cross-sectional view illustrating the method of fabricating the semiconductor device shown in FIG. 1.
Figure 5:
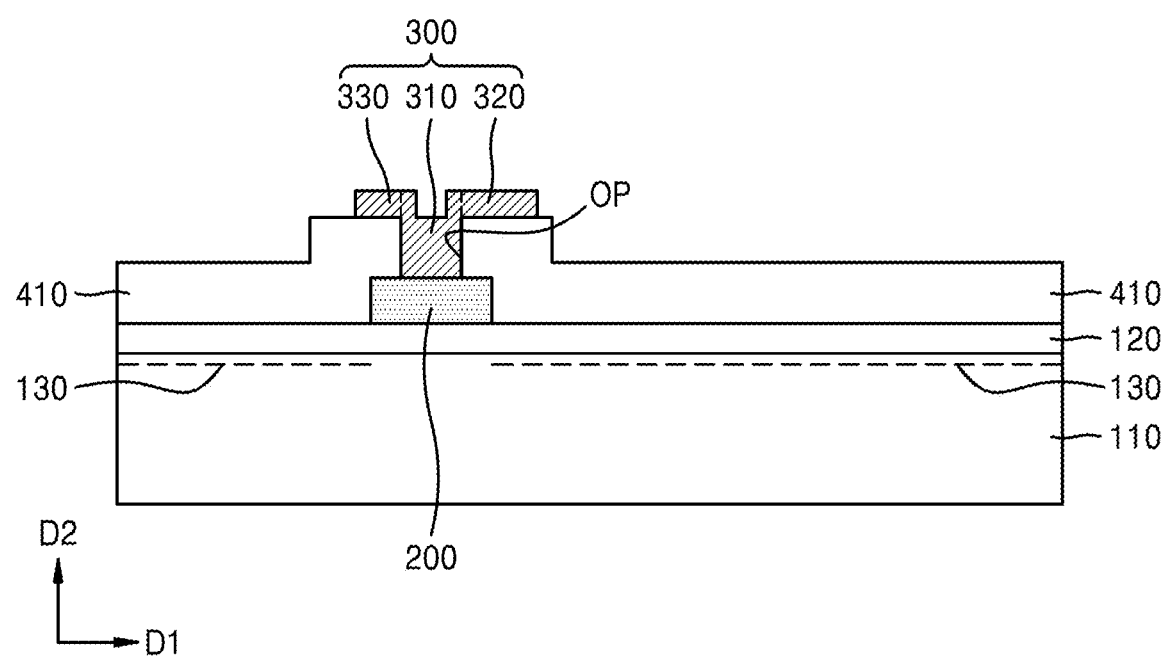
FIG. 5 is a cross-sectional view illustrating the method of fabricating the semiconductor device shown in FIG. 1.
Figure 6:
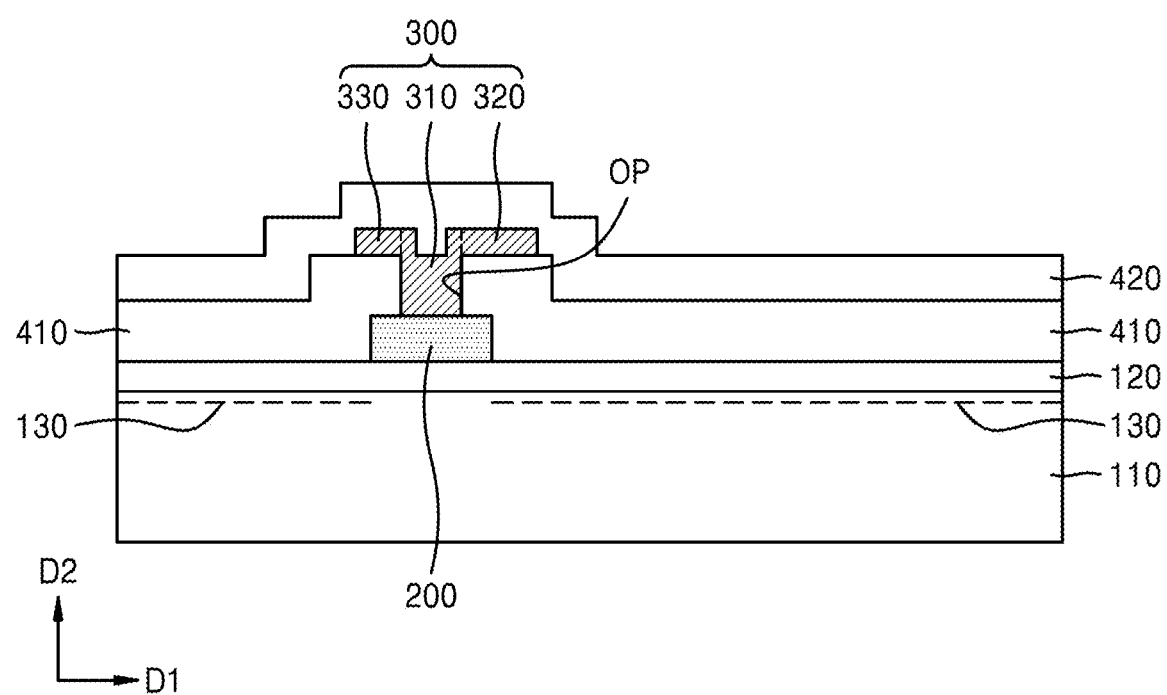
FIG. 6 is a cross-sectional view illustrating the method of fabricating the semiconductor device shown in FIG. 1.
Figure 7:
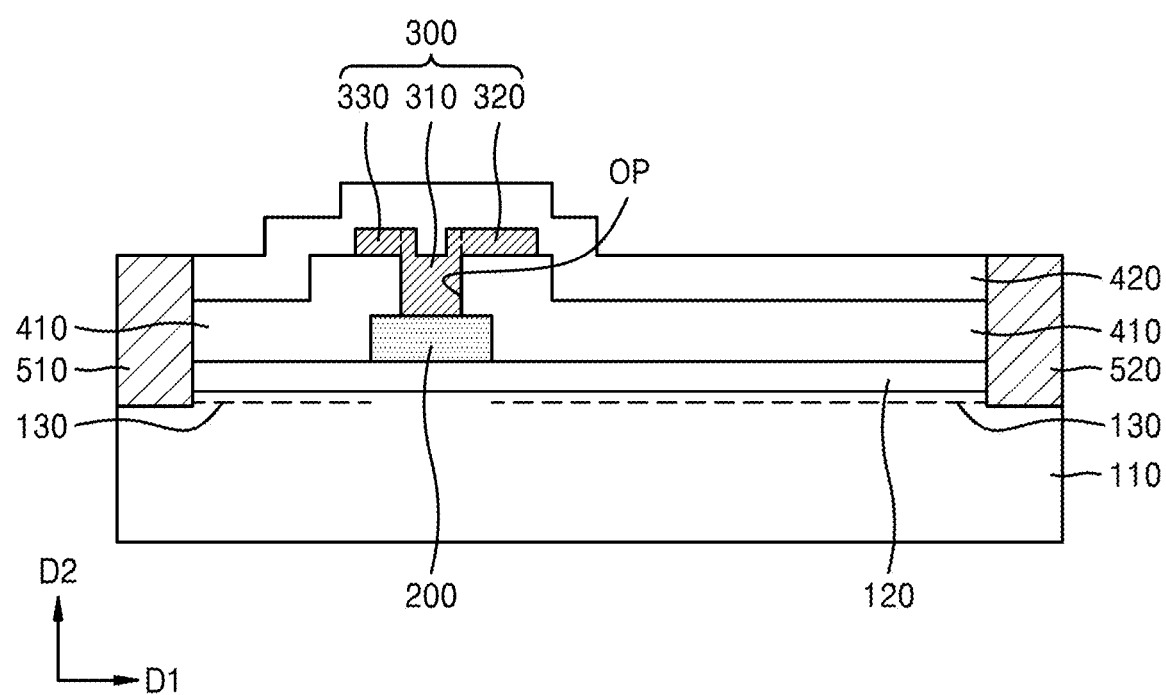
FIG. 7 is a cross-sectional view illustrating the method of fabricating the semiconductor device shown in FIG. 1.

FIG. 2 is a cross-sectional view illustrating a method of fabricating the semiconductor device 10 shown in FIG. 1. FIG. 3 is a cross-sectional view illustrating the method of fabricating the semiconductor device 10 shown in FIG. 1. FIG. 4 is a cross-sectional view illustrating the method of fabricating the semiconductor device 10 shown in FIG. 1. FIG. 5 is a cross-sectional view illustrating the method of fabricating the semiconductor device 10 shown in FIG. 1. FIG. 6 is a cross-sectional view illustrating the method of fabricating the semiconductor device 10 shown in FIG. 1. FIG. 7 is a cross-sectional view illustrating the method of fabricating the semiconductor device 10 shown in FIG. 1. For clarity of illustration, substantially the same structures as those described with reference to FIG. 1 may not be described here.

Referring to FIG. 2, a channel layer 110 and a channel supply layer 120 may be sequentially stacked. For example, the channel layer 110 and the channel supply layer 120 may be formed on a substrate (not shown) by an epitaxial growth process. For example, the epitaxial growth process may include at least one of a metal organic chemical vapor deposition process, a liquid phase epitaxy process, a hydrogen vapor phase epitaxy process, a molecular beam epitaxy process, or a metal organic vapor phase epitaxy process. For example, the substrate may be a silicon substrate, a SiC substrate, a GaN substrate, a diamond substrate, or a sapphire substrate.

The channel layer 110 may include a group III-V compound semiconductor. For example, the channel layer 110 may include GaN. The channel supply layer 120 may be a semiconductor layer different from the channel layer 110. The channel supply layer 120 may be different from the channel layer 110 in at least one of polarization characteristics, energy bandgap, and lattice constant. The channel supply layer 120 may include at least one material selected from nitrides including at least one selected from the group consisting of aluminum (Al), gallium (Ga), indium (In), and boron (B). For example, the channel supply layer 120 may include at least one selected from the group consisting of AlGaN, AlInN, InGaN, AlN, and AlInGaN. The channel supply layer 120 may have a single-layer structure or a multi-layer structure.

The channel supply layer 120 may form a 2DEG layer 130 in the channel layer 110. The 2DEG layer 130 may be formed in the channel layer 110 adjacent to the interface between the channel supply layer 120 and the channel layer 110. The 2DEG layer 130 may extend in a first direction D1 parallel to an upper surface of the channel layer 110.

A channel separation pattern 200 may be formed on the channel supply layer 120. The forming of the channel separation pattern 200 may include forming a channel separation film (not shown) on the channel supply layer 120 and patterning the channel separation film. For example, the channel separation film may be formed on the channel supply layer 120 by an epitaxial growth process.

The channel separation film may include a group III-V compound semiconductor. For example, the channel separation film may include at least one selected from the group consisting of GaN, AlGaN, InN, AlInN, InGaN, and AlInGaN. The channel separation film may be a p-type semiconductor layer or a layer doped with a p-type dopant. For example, the channel separation film may be doped with a p-type dopant such as magnesium (Mg). For example, the channel separation film may be a p-type GaN layer or a p-type AlGaN layer.

In an example, the channel separation film may be patterned through an etching process using an etching mask (not shown). The patterned channel separation film may be referred to as the channel separation pattern 200. The channel separation pattern 200 may increase the energy band of a portion of the channel supply layer 120 which is below the channel separation pattern 200. A depletion region (not shown) may be formed in the 2DEG layer 130 under the channel separation pattern 200. The 2DEG layer 130 may be broken in a region adjacent to the channel separation pattern 200 by the depletion region. Therefore, the semiconductor device 10 may have a normally-off characteristic. The etching mask may be removed during or after the etching process.

Referring to FIG. 3, a first passivation film 410 may be formed on the channel supply layer 120 and the channel separation pattern 200. A process of forming the first passivation film 410 may include depositing an insulating material on the channel supply layer 120 and the channel separation pattern 200. For example, the first passivation film 410 may be formed through a chemical vapor deposition (CVD) process, a physical vapor deposition (PVD) process, or an atomic layer deposition (ALD) process. For example, the first passivation film 410 may include an oxide, a nitride, or a combination thereof. For example, the first passivation film 410 may include at least one selected from the group consisting of $SiO_2$, $Al_2O_3$, and $Si_xN_y$.

An opening OP may be formed in the first passivation film 410. A process of forming the opening OP may include performing an etching process using an etching mask on the first passivation film 410. The etching process may be performed until an upper surface of the channel separation pattern 200 is exposed. In other words, the opening OP may be formed through the first passivation film 410 to expose the upper surface of the channel separation pattern 200. The etching mask may be removed during or after the etching process.

Referring to FIG. 4, a conductive material film 302 may be formed on the first passivation film 410. The conductive material film 302 may extend along the first passivation film 410. The conductive material film 302 may extend into the opening OP. Although it is illustrated that the conductive material film 302 completely fills the opening OP, this is a non-limiting example. In another example, the conductive material film 302 may partially fill the opening OP. The conductive material film 302 may be in direct contact with the channel separation pattern 200. A process of forming the conductive material film 302 may include depositing an electrically conductive material on the first passivation film 410. For example, the conductive material film 302 may be formed through a CVD process, a PVD process, or an ALD process. For example, the conductive material film 302 may include a metal.

Referring to FIG. 5, a conductive material pattern 300 may be formed. The conductive material pattern 300 may be formed by performing an etching process using an etching mask on the conductive material film 302. The conductive material pattern 300 may extend from the inside of the opening OP to the outside of the opening OP. The conductive material pattern 300 may include a gate electrode pattern 310, an electric-field relaxation pattern 320, and a protruding pattern 330. The gate electrode pattern 310, the electric-field relaxation pattern 320, and the protruding pattern 330 may be substantially the same as those described with reference to FIG. 1. Since the gate electrode pattern 310 and the electric-field relaxation pattern 320 are formed at the same time, the time, complexity, and costs of the forming process may be reduced compared to the case in which the gate electrode pattern 310 and the electric-field relaxation pattern 320 are formed through separate processes. The etching mask may be removed during or after the etching process.

Referring to FIG. 6, a second passivation film 420 may be formed on the conductive material pattern 300 and the first passivation film 410. A process of forming the second passivation film 420 may include depositing an insulating material on the first passivation film 410 and the conductive material pattern 300. For example, the second passivation film 420 may be formed through a CVD process, a PVD process, or an ALD process. For example, the second passivation film 420 may include an oxide, a nitride, or a combination thereof. For example, the second passivation film 420 may include at least one selected from the group consisting of $SiO_2$, $Al_2O_3$, and $Si_xN_y$.

Referring to FIG. 7, a source electrode pattern 510 and a drain electrode pattern 520 may be formed. The forming of the source electrode pattern 510 and the drain electrode pattern 520 may include performing an etching process to remove the second passivation film 420, the first passivation film 410, and the channel supply layer 120 in two regions which are apart from each other with the conductive material pattern 300 therebetween and filling the two regions with an electrically conductive material. During the etching process, upper portions of the channel layer 110 may also be removed. For example, the etching process may be performed up to a position deeper than the depth at which the 2DEG layer 130 is formed in the channel layer 110. Therefore, the source electrode pattern 510 and the drain electrode pattern 520 may be in direct contact with the 2DEG layer.

Referring back to FIG. 1, an additional electric-field relaxation film 610 and a first auxiliary drain electrode pattern 700 may be formed on the source electrode pattern 510 and the drain electrode pattern 520, respectively. The forming of the additional electric-field relaxation film 610 and the first auxiliary drain electrode pattern 700 may include forming an electrically conductive film (not shown) on the source electrode pattern 510, the second passivation film 420, and the drain electrode pattern 520 and etching portions of the electrically conductive film. The etching may be performed on a portion of the electrically conductive film which is between the conductive material pattern 300 and the drain electrode pattern 520. The etching may be performed until an upper surface of the second passivation film 420 is exposed. Therefore, the electrically conductive film may be divided into the additional electric-field relaxation film 610 and the first auxiliary drain electrode pattern 700. The additional electric-field relaxation film 610 and the first auxiliary drain electrode pattern 700 may be substantially the same as those described with reference to FIG. 1.

In the present embodiments, the gate electrode pattern 310 and the electric-field relaxation pattern 320 may be simultaneously formed. Therefore, the time, complexity, and costs of the forming process may be reduced compared to the case in which the gate electrode pattern 310 and the electric-field relaxation pattern 320 are formed through separate processes. As a result, a semiconductor device fabricating method which improves process efficiency may be provided.

Figure 8:
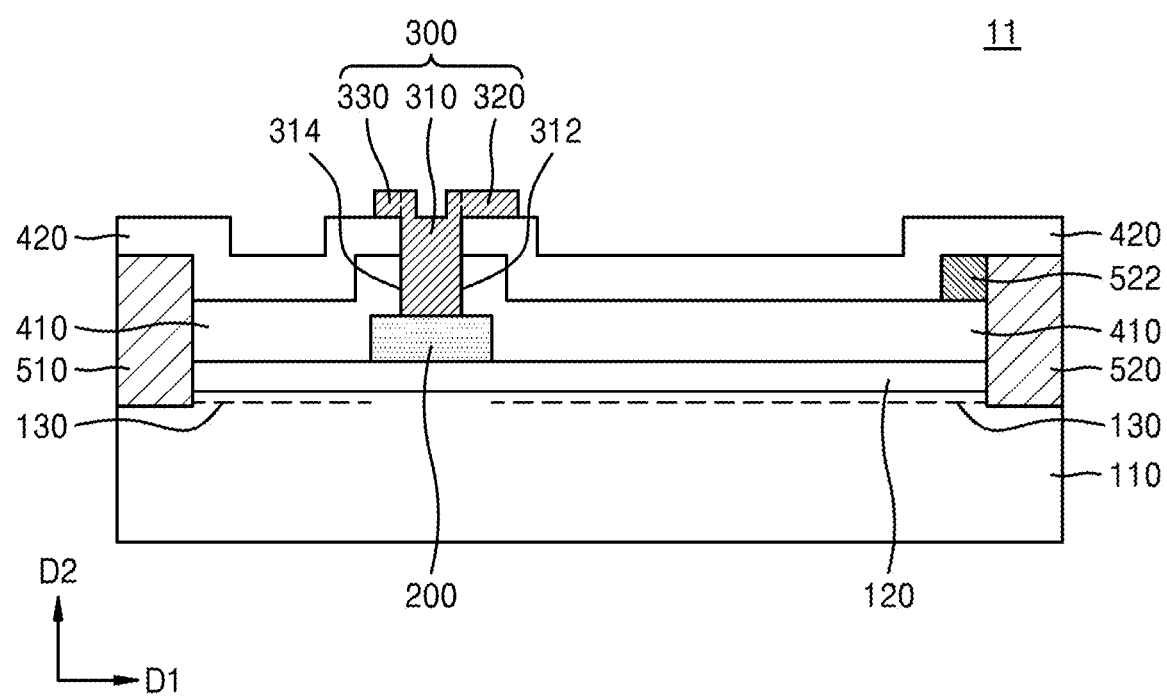
FIG. 8 is a cross-sectional view illustrating a semiconductor device according to example embodiments.

FIG. 8 is a cross-sectional view illustrating a semiconductor device 11 according to example embodiments. For clarity of illustration, substantially the same structures as those described with reference to FIG. 1 may not be described here.

Referring to FIG. 8, the semiconductor device 11 may be provided. The semiconductor device 11 may include a channel layer 110, a channel supply layer 120, a channel separation pattern 200, a first passivation film 410, a source electrode pattern 510, a drain electrode pattern 520, a second auxiliary drain electrode pattern 522, a second passivation film 420, and a conductive material pattern 300. The channel layer 110, the channel supply layer 120, and the channel separation pattern 200 may be substantially the same as those described with reference to FIG. 1.

The first passivation film 410 may be provided on the channel supply layer 120 and the channel separation pattern 200. The first passivation film 410 may extend along the channel supply layer 120. The first passivation film 410 may cover the channel separation pattern 200. The first passivation film 410 may include an insulating material.

The source electrode pattern 510 and the drain electrode pattern 520 may be apart from each other with a gate electrode pattern 310 therebetween. The source electrode pattern 510 and the drain electrode pattern 520 may be apart from each other in a first direction D1. The source electrode pattern 510 and the drain electrode pattern 520 may pass through the first passivation film 410 and the channel supply layer 120. The source electrode pattern 510 and the drain electrode pattern 520 may be electrically connected to a 2DEG layer 130. For example, the source electrode pattern 510 and the drain electrode pattern 520 may extend into the channel layer 110 and may directly make contact with the 2DEG layer 130. The source electrode pattern 510 and the drain electrode pattern 520 may make ohmic contact with the channel supply layer 120. The source electrode pattern 510 and the drain electrode pattern 520 may have a single-layer structure or a multi-layer structure. For example, the source electrode pattern 510 and the drain electrode pattern 520 may include at least one selected from the group consisting of titanium (Ti), aluminum (Al), nickel (Ni), and gold (Au).

The second passivation film 420 may be provided on the first passivation film 410, the source electrode pattern 510, and the drain electrode pattern 520. The second passivation film 420 may extend along an upper surface of the first passivation film 410. The second passivation film 420 may cover the source electrode pattern 510 and the drain electrode pattern 520. The second passivation film 420 may include an insulating material.

The second auxiliary drain electrode pattern 522 may be provided among the drain electrode pattern 520, the first passivation film 410, and the second passivation film 420. The second auxiliary drain electrode pattern 522 may be provided on a lateral surface of the drain electrode pattern 520 between the first passivation film 410 and the second passivation film 420. The second auxiliary drain electrode pattern 522 may be electrically connected to the drain electrode pattern 520. For example, the second auxiliary drain electrode pattern 522 may be in direct contact with the drain electrode pattern 520. In an example, the second auxiliary drain electrode pattern 522 may form a single structure together with the drain electrode pattern 520. In other words, the second auxiliary drain electrode pattern 522 and the drain electrode pattern 520 may be connected to each other without any interface therebetween. The second auxiliary drain electrode pattern 522 may include an electrically conductive material. For example, the second auxiliary drain electrode pattern 522 may include a metal.

The conductive material pattern 300 may extend onto the second passivation film 420 from the channel separation pattern 200. The gate electrode pattern 310 may pass through the second passivation film 420 and the first passivation film 410 and may make direct contact with the channel separation pattern 200. The gate electrode pattern 310 may protrude onto an upper surface of the second passivation film 420. An electric-field relaxation pattern 320 may from a first lateral surface 312 of the gate electrode pattern 310 toward the drain electrode pattern 520. The electric-field relaxation pattern 320 may extend along the upper surface of the second passivation film 420. A protruding pattern 330 may protrude from a second lateral surface 314 of the gate electrode pattern 310 toward the source electrode pattern 510. The protruding pattern 330 may extend along the upper surface of the second passivation film 420.

In the present embodiments, the gate electrode pattern 310 may have a width different from that of the channel separation pattern 200. Therefore, leakage current flowing through lateral surfaces of the gate electrode pattern 310 and the channel separation pattern 200 may be reduced, or it may be possible to limit and/or prevent the leakage current. In the present embodiments, the electric-field relaxation pattern 320 and the second auxiliary drain electrode pattern 522 may reduce or prevent the concentration of an electric field between the gate electrode pattern 310 and the drain electrode pattern 520. According to the present embodiments, the electrical characteristics of the semiconductor device 11 may be improved.

Figure 9:
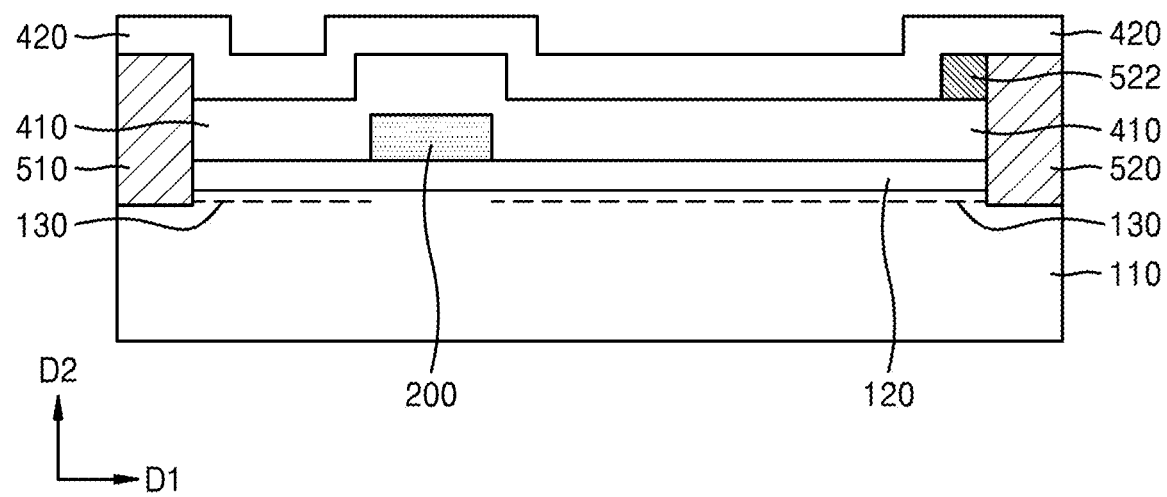
FIG. 9 is a cross-sectional view illustrating a method of fabricating the semiconductor device shown in FIG. 8.
Figure 10:
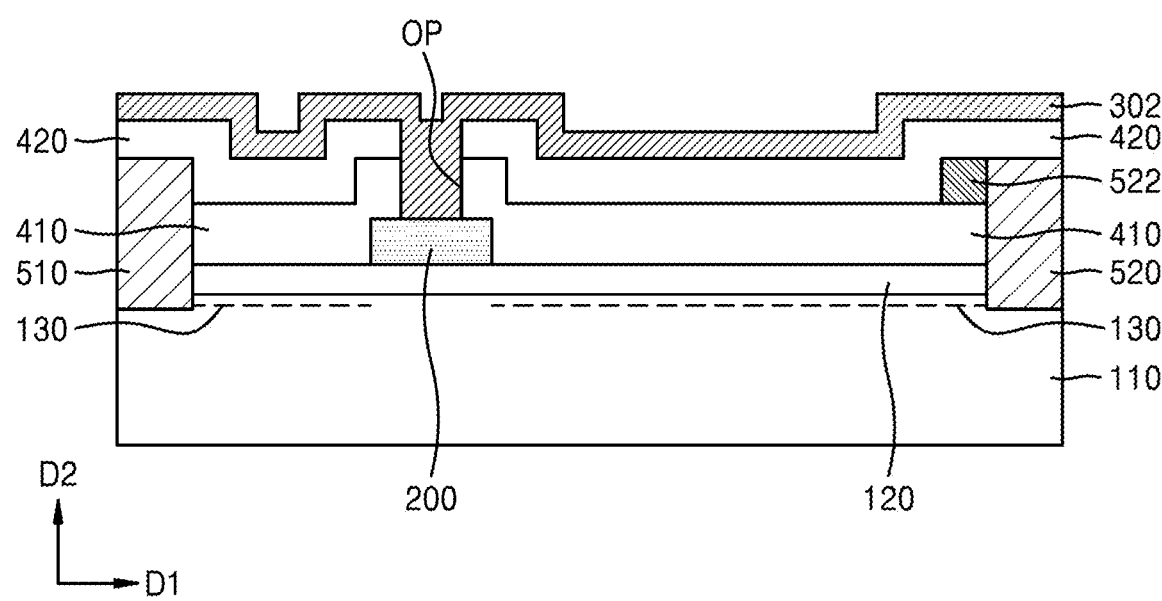
FIG. 10 is a cross-sectional view illustrating the method of fabricating the semiconductor device shown in FIG. 8.

FIG. 9 is a cross-sectional view illustrating a method of fabricating the semiconductor device 11 shown in FIG. 1. FIG. 10 is a cross-sectional view illustrating the method of fabricating the semiconductor device 11 shown in FIG. 1. For clarity of illustration, substantially the same structures as those described with reference to FIGS. 2 to 7 may not be described here.

Referring to FIG. 9, a channel layer 110, a channel supply layer 120, a channel separation pattern 200, a first passivation film 410, a source electrode pattern 510, a drain electrode pattern 520, a second auxiliary drain electrode pattern 522, and a second passivation film 420 may be formed. The forming of the channel layer 110, the channel supply layer 120, the channel separation pattern 200, and the first passivation film 410 may be substantially the same as that described with reference to FIGS. 2 and 3.

A source electrode pattern 510 and a drain electrode pattern 520 may be formed. The forming of the source electrode pattern 510 and the drain electrode pattern 520 may include performing an etching process to remove the second passivation film 420, the first passivation film 410, and the channel supply layer 120 in two regions which are apart from each other with a conductive material pattern 300 therebetween and filling the two regions with an electrically conductive material. During the etching process, upper portions of the channel layer 110 may also be removed. For example, the etching process may be performed up to a position deeper than the depth at which a 2DEG layer 130 is formed in the channel layer 110. Therefore, the source electrode pattern 510 and the drain electrode pattern 520 may be electrically connected to the 2DEG layer.

The second auxiliary drain electrode pattern 522 may be formed on a lateral surface of the drain electrode pattern 520. The second auxiliary drain electrode pattern 522 may protrude from the lateral surface of the drain electrode pattern 520 onto the first passivation film 410. In an example, the second auxiliary drain electrode pattern 522 may also be formed when the process of forming the source electrode pattern 510 and the drain electrode pattern 520 is performed. The second auxiliary drain electrode pattern 522 and the drain electrode pattern 520 may be connected to each other without any interface therebetween. In another example, the second auxiliary drain electrode pattern 522 may be formed through a process different from the process of forming the source electrode pattern 510 and the drain electrode pattern 520. For example, after the source electrode pattern 510 and the drain electrode pattern 520 are formed, the second auxiliary drain electrode pattern 522 may be formed on the first passivation film 410 at a position immediately adjacent to the drain electrode pattern 520.

The second passivation film 420 may be formed on the first passivation film 410. The second passivation film 420 may cover the first passivation film 410, the second auxiliary drain electrode pattern 522, the source electrode pattern 510, and the drain electrode pattern 520. A process of forming the second passivation film 420 may include depositing an insulating material on the first passivation film 410. For example, the second passivation film 420 may be formed through a CVD process, a PVD process, or an ALD process. For example, the second passivation film 420 may include an oxide, a nitride, or a combination thereof. For example, the second passivation film 420 may include at least one selected from the group consisting of $SiO_2$, $Al_2O_3$, and $Si_xN_y$.

Referring to FIG. 10, an opening OP may be formed in the second passivation film 420 and the first passivation film 410. A process of forming the opening OP may include performing an etching process using an etching mask on the second passivation film 420 and the first passivation film 410. The etching process may be performed until an upper surface of the channel separation pattern 200 is exposed. In other words, the opening OP may be formed through the second passivation film 420 and the first passivation film 410 to expose the upper surface of the channel separation pattern 200. The etching mask may be removed during or after the etching process.

A conductive material film 302 may be formed on the second passivation film 420. The conductive material film 302 may extend along the second passivation film 420 and may fill the opening OP. The conductive material film 302 may be in direct contact with the channel separation pattern 200. A process of forming the conductive material film 302 may include depositing an electrically conductive material on the second passivation film 420. For example, the conductive material film 302 may be formed through a CVD process, a PVD process, or an ALD process. For example, the conductive material film 302 may include a metal.

Referring to FIG. 8, the conductive material pattern 300 may be formed. The conductive material pattern 300 may be formed through an etching process using an etching mask (not shown) on the conductive material film 302. The etching mask may be removed during or after the etching process. After the etching process, a portion of the conductive material film 302 adjacent to the opening OP may remain. The remaining portion of the conductive material film 302 may be referred to as the conductive material pattern 300. The conductive material pattern 300 may extend from the inside of the opening OP to the outside of the opening OP. The conductive material pattern 300 may include a gate electrode pattern 310, an electric-field relaxation pattern 320, and a protruding pattern 330. The gate electrode pattern 310, the electric-field relaxation pattern 320, and the protruding pattern 330 may be substantially the same as those described with reference to FIG. 8.

In the present embodiments, the gate electrode pattern 310 and the electric-field relaxation pattern 320 may be simultaneously formed. Therefore, the time, complexity, and costs of the forming process may be reduced compared to the case in which the gate electrode pattern 310 and the electric-field relaxation pattern 320 are formed through separate processes. As a result, a semiconductor device fabricating method which improves process efficiency may be provided.

Figure 11:
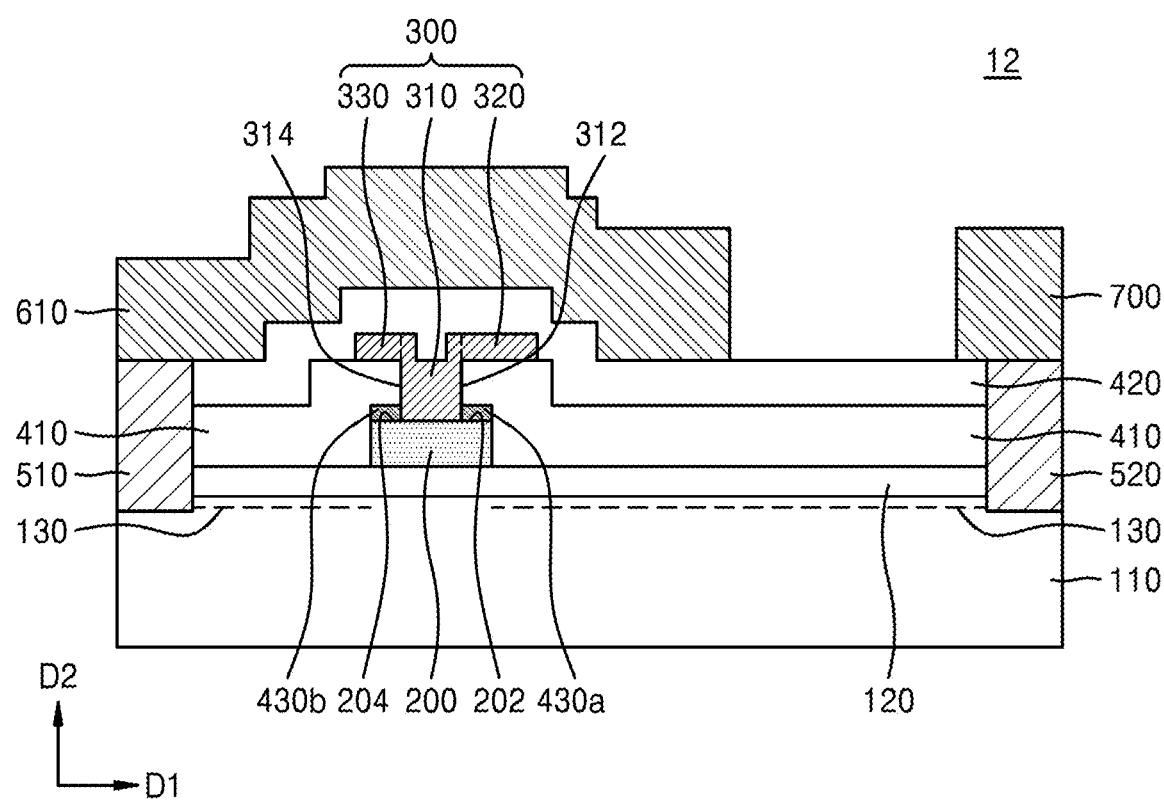
FIG. 11 is a cross-sectional view illustrating a semiconductor device according to example embodiments.

FIG. 11 is a cross-sectional view illustrating a semiconductor device 12 according to example embodiments. For clarity of illustration, substantially the same structures as those described with reference to FIG. 1 may not be described here.

Referring to FIG. 11, the semiconductor device 12 may be provided. The semiconductor device 12 may include a channel layer 110, a channel supply layer 120, a channel separation pattern 200, a first passivation pattern 430a, a second passivation pattern 430b, a first passivation film 410, a conductive material pattern 300, a second passivation film 420, a source electrode pattern 510, a drain electrode pattern 520, an additional electric-field relaxation film 610, and a first auxiliary drain electrode pattern 700.

Unlike the semiconductor device 10 described with reference to FIG. 1, the semiconductor device 12 may further include first and second passivation patterns 430a and 430b. The first passivation pattern 430a and the second passivation pattern 430b may be provided among the first passivation film 410, the channel separation pattern 200, and a gate electrode pattern 310. The first passivation pattern 430a and the second passivation pattern 430b are respectively provided on a first upper surface 202 and a second upper surface 204 of the channel separation pattern 200 which are exposed by the gate electrode pattern 310. The first upper surface 202 and the second upper surface 204 of the channel separation pattern 200 may be respectively exposed at a first lateral surface 312 and a second lateral surface 314 of the gate electrode pattern 310. The first passivation pattern 430a and the second passivation pattern 430b may be in direct contact with first lateral surface 312 and the second lateral surface 314 of the gate electrode pattern 310, respectively. A lateral surface of the first passivation pattern 430a and a lateral surface of the channel separation pattern 200 immediately adjacent to the lateral surface of the first passivation pattern 430a may be coplanar. A lateral surface of the second passivation pattern 430b and another lateral surface of the channel separation pattern 200 immediately adjacent to the lateral surface of the second passivation pattern 430b may be coplanar. The first passivation pattern 430a and the second passivation pattern 430b may have a high etch selectivity with respect to the channel separation pattern 200. For example, the first passivation pattern 430a and the second passivation pattern 430b may have an etch selectivity of greater than about 1 with respect to the channel separation pattern 200. The first passivation pattern 430a and the second passivation pattern 430b may have a low etch selectivity with respect to the first passivation film 410. For example, the first passivation pattern 430a and the second passivation pattern 430b may have an etch selectivity of less than about 1 with respect to the first passivation film 410. For example, the first passivation pattern 430a and the second passivation pattern 430b may include an oxide. For example, the first passivation pattern 430a and the second passivation pattern 430b may include $SiO_2$.

In the present embodiments, the gate electrode pattern 310 may have a width different from that of the channel separation pattern 200. Therefore, leakage current flowing through lateral surfaces of the gate electrode pattern 310 and the channel separation pattern 200 may be reduced, or it may be possible to limit and/or prevent the leakage current. In the present embodiments, an electric-field relaxation pattern 320 may reduce or prevent the concentration of an electric field between the gate electrode pattern 310 and the drain electrode pattern 520. According to the present embodiments, the electrical characteristics of the semiconductor device 12 may be improved.

According to the present embodiments, conditions for the etch selectivity of the first passivation film 410 with respect to the channel separation pattern 200 may be eased or removed. Therefore, the range of materials that may be used as the first passivation film 410 may be widened. As a result, the electrical characteristics of the semiconductor device 12 may be improved.

Figure 12:
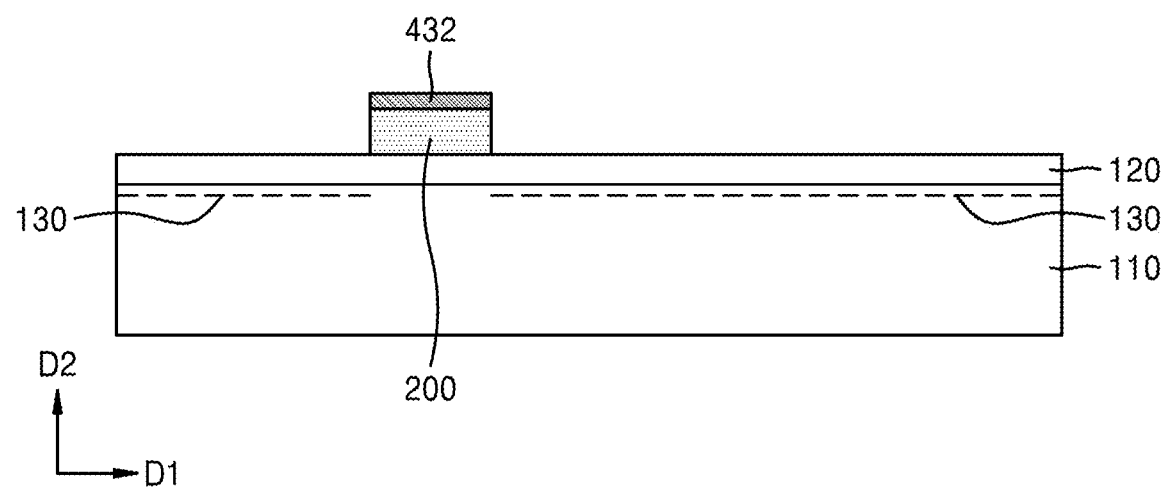
FIG. 12 is a cross-sectional view illustrating a method of fabricating the semiconductor device shown in FIG. 11.
Figure 13:
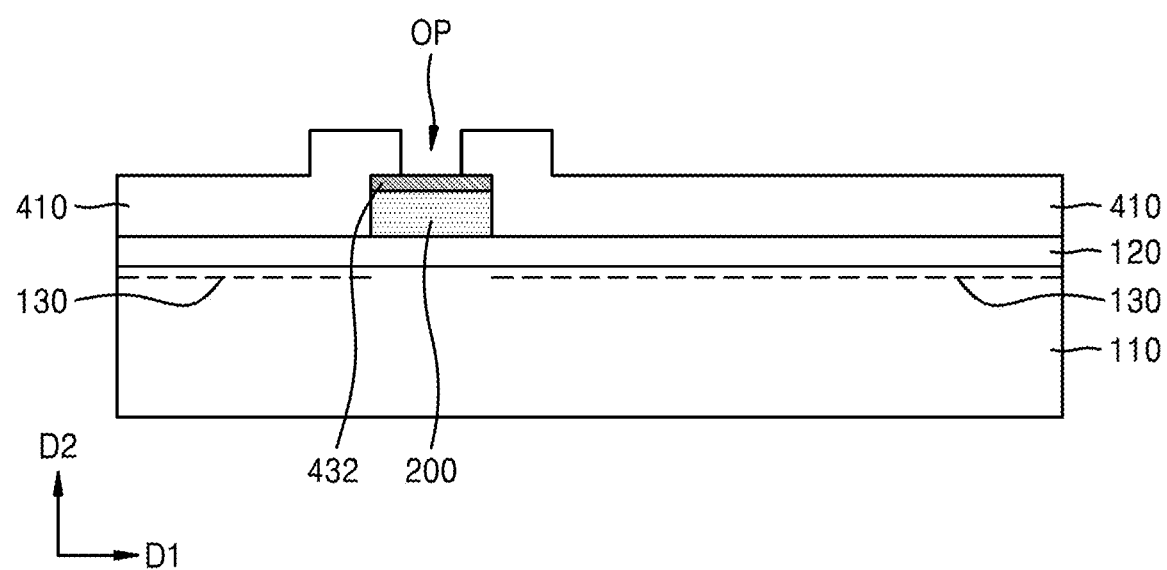
FIG. 13 is a cross-sectional view illustrating the method of fabricating the semiconductor device shown in FIG. 11.
Figure 14:
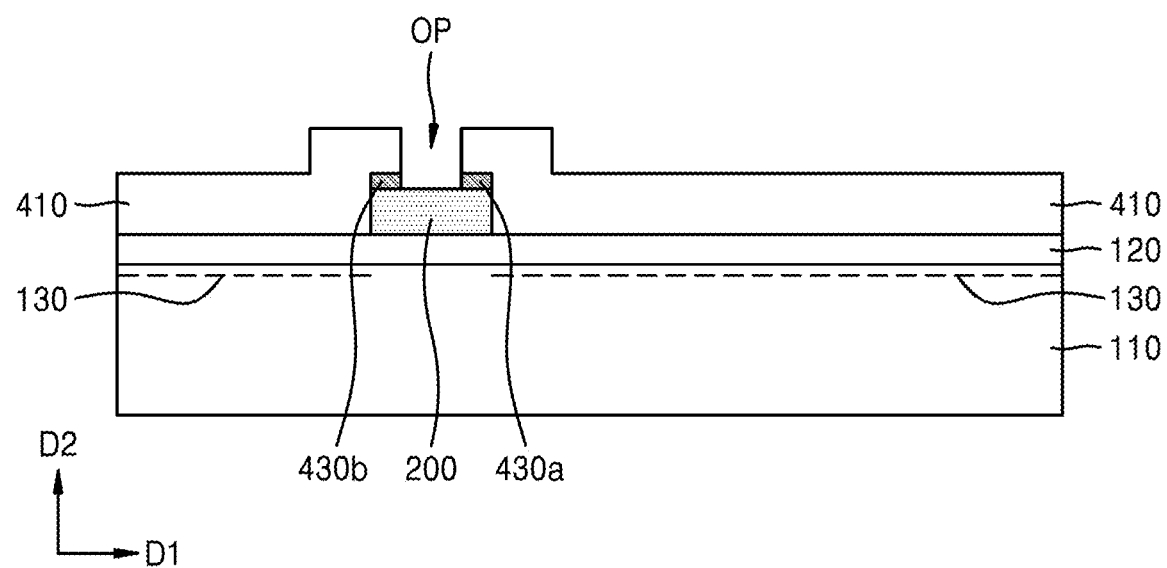
FIG. 14 is a cross-sectional view illustrating the method of fabricating the semiconductor device shown in FIG. 11.

FIG. 12 is a cross-sectional view illustrating a method of fabricating the semiconductor device 12 shown in FIG. 11. FIG. 13 is a cross-sectional view illustrating the method of fabricating the semiconductor device 12 shown in FIG. 11. FIG. 14 is a cross-sectional view illustrating the method of fabricating the semiconductor device 12 shown in FIG. 11.

For clarity of illustration, substantially the same structures as those described with reference to FIGS. 2 to 7 may not be described here.

Referring to FIG. 12, a channel supply layer 120 may be formed on a channel layer 110, and thus a 2DEG layer 130 may be formed in the channel layer 110. The channel layer 110 and the channel supply layer 120 may be formed in substantially the same manner as that described with reference to FIG. 2.

A channel separation pattern 200 and a preliminary passivation pattern 432 may be sequentially stacked on the channel supply layer 120. The forming of the channel separation pattern 200 and the preliminary passivation pattern 432 may include forming a channel separation film (not shown) on the channel supply layer 120; forming a preliminary passivation film (not shown) on the channel separation film and patterning the preliminary passivation film and the channel separation film. The forming of the channel separation film may be substantially the same as that described with reference to FIG. 2.

The forming of the preliminary passivation film may include a deposition process. For example, the preliminary passivation film may be formed through a CVD process, a PVD process, or an ALD process. The preliminary passivation film may include an insulating material. The preliminary passivation film may include a material having an etch selectivity with respect to the channel separation film. For example, the preliminary passivation film may have an etch selectivity of greater than about 1 with respect to the channel separation film. For example, the preliminary passivation film may include an oxide. For example, the preliminary passivation film may include $SiO_2$.

The preliminary passivation film and the channel separation film may be patterned through an etching process using an etching mask. The patterned preliminary passivation film may be referred to as the preliminary passivation pattern 432. The patterned channel separation film may be referred to as the channel separation pattern 200. The etching mask may be removed during or after the etching process.

Referring to FIG. 13, a first passivation film 410 may be formed on the channel supply layer 120 and the preliminary passivation pattern 432. A process of forming the first passivation film 410 may include depositing an insulating material on the channel supply layer 120 and the preliminary passivation pattern 432. The first passivation film 410 may have an etch selectivity with respect to the preliminary passivation pattern 432. For example, the first passivation film 410 may have an etch selectivity of greater than about 1 with respect to the preliminary passivation pattern 432. For example, the first passivation film 410 may include a nitride. For example, the first passivation film 410 may include $Si_xN_y$. For example, the first passivation film 410 may be formed through a CVD process, a PVD process, or an ALD process.

An opening OP may be formed in the first passivation film 410. A process of forming the opening OP may include performing a first selective etching process using an etching mask (not shown) on the first passivation film 410. The first selective etching process may be performed until an upper surface of the preliminary passivation pattern 432 is exposed. In other words, the opening OP may be formed through the first passivation film 410 to expose the upper surface of the preliminary passivation pattern 432. Since the preliminary passivation pattern 432 has a low etch selectivity with respect to the first passivation film 410, the preliminary passivation pattern 432 may function as an etch stop film in the first selective etching process.

Referring to FIG. 14, a second selective etching process may be performed on the preliminary passivation pattern 432 to form a first passivation pattern 430a and a second passivation pattern 430b. The second selective etching process may be performed until an upper surface of the channel separation pattern 200 is exposed. Therefore, the opening OP may be further extended. The opening OP may pass through the preliminary passivation pattern 432 to expose the upper surface of the channel separation pattern 200. Since the channel separation pattern 200 has a low etch selectivity with respect to the preliminary passivation pattern 432, the channel separation pattern 200 may function as an etch stop film in the second selective etching process. The etching mask may be removed during the first selective etching process, after the first selective etching process, during the second selective etching process, or after the second selective etching process.

Referring back to FIG. 11, a conductive material pattern 300, a second passivation film 420, a source electrode pattern 510, a drain electrode pattern 520, an additional electric-field relaxation film 610, and a first auxiliary drain electrode pattern 700 may be formed. The forming of the conductive material pattern 300 may be substantially the same as that described with reference to FIGS. 4 and 5. The forming of the second passivation film 420 may be substantially the same as that described with reference to FIG. 6. The forming the source electrode pattern 510 and the drain electrode pattern 520 may be substantially the same as that described with reference to FIG. 7. The forming of the additional electric-field relaxation film 610 and the first auxiliary drain electrode pattern 700 may be substantially the same as that described with reference to FIG. 1.

In the present embodiments, a gate electrode pattern 310 and an electric-field relaxation pattern 320 may be simultaneously formed. Therefore, the time, complexity, and costs of the process of forming the gate electrode pattern 310 and the electric-field relaxation pattern 320 may be reduced compared to the case in which the gate electrode pattern 310 and the electric-field relaxation pattern 320 are formed through separate processes. As a result, a semiconductor device fabricating method which improves process efficiency may be provided.

In the present embodiments, the first passivation film 410 may have an etch selectivity with respect to the preliminary passivation pattern 432, and the preliminary passivation pattern 432 may have an etch selectivity with respect to the channel separation pattern 200. Therefore, the precision of the etching processes may be improved. In addition, the range of materials that may be used as the first passivation film 410 is widened, and thus the difficulty of processes may be reduced.

Figure 15:
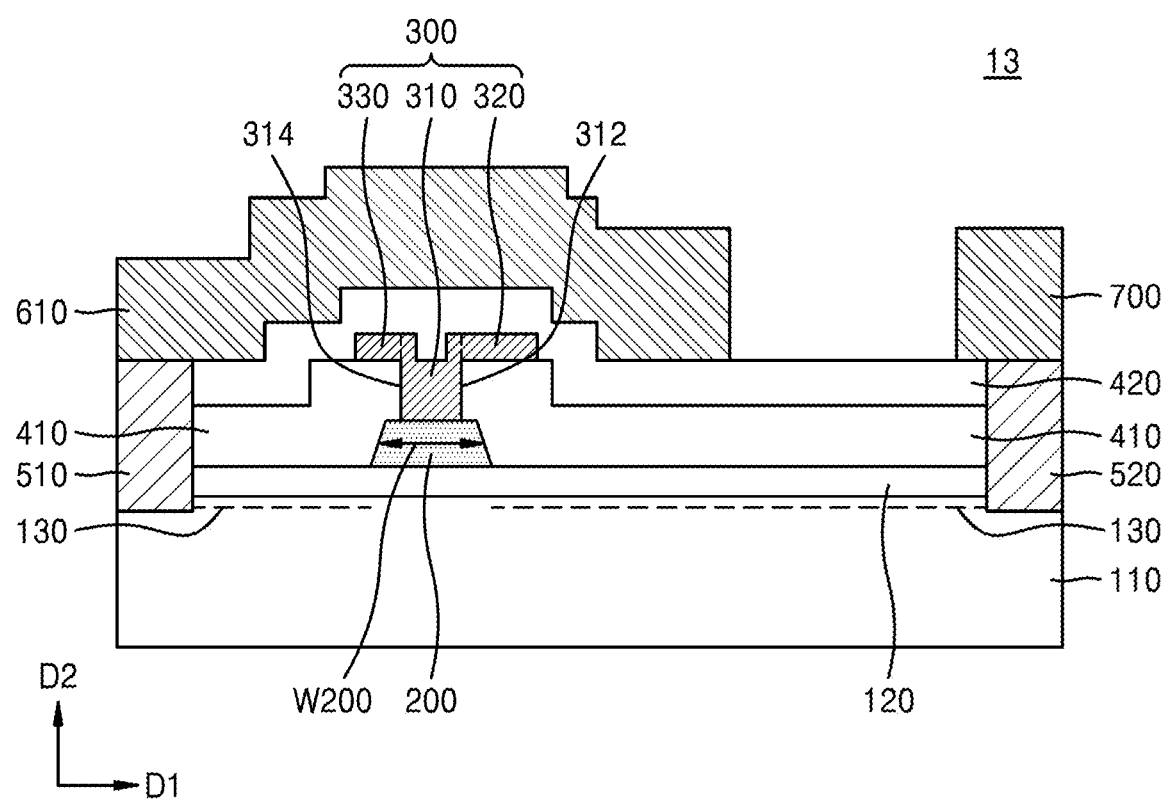
FIG. 15 is a cross-sectional view illustrating a semiconductor device according to example embodiments.

FIG. 15 is a cross-sectional view illustrating a semiconductor device 13 according to example embodiments. For clarity of illustration, substantially the same structures as those described with reference to FIG. 1 may not be described here.

Referring to FIG. 15, the semiconductor device 13 may be provided. The semiconductor device 13 may include a channel layer 110, a channel supply layer 120, a channel separation pattern 200, a first passivation film 410, a conductive material pattern 300, a second passivation film 420, a source electrode pattern 510, a drain electrode pattern 520, an additional electric-field relaxation film 610, and a first auxiliary drain electrode pattern 700.

Unlike the description given with reference to FIG. 1, the channel separation pattern 200 may be tapered in a second direction D2. That is, the channel separation pattern 200 may have a width W200 decreasing in the second direction D2. The width W200 of the channel separation pattern 200 may be a size of the channel separation pattern 200 in a first direction D1. The width W200 of the channel separation pattern 200 may reduce in a direction toward a gate electrode pattern 310. The width W200 of the channel separation pattern 200 may increase in a direction toward the channel supply layer 120.

In the present embodiments, the gate electrode pattern 310 may have a width different from that of the channel separation pattern 200. Therefore, leakage current flowing through lateral surfaces of the gate electrode pattern 310 and the channel separation pattern 200 may be reduced, or it may be possible to limit and/or prevent the leakage current. In the present embodiments, an electric-field relaxation pattern 320 and the additional electric-field relaxation film 610 may reduce or prevent the concentration of an electric field between the gate electrode pattern 310 and the drain electrode pattern 520. According to the present embodiments, the electrical characteristics of the semiconductor device 13 may be improved.

Figure 16:
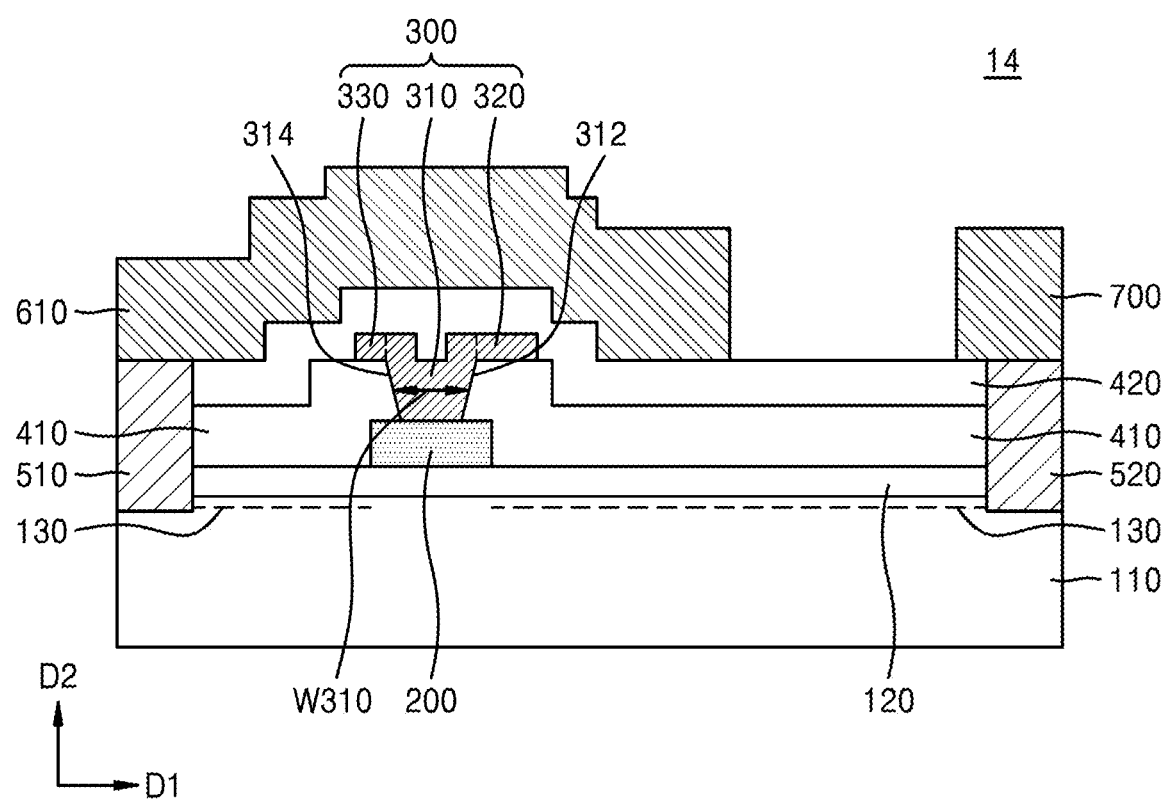
FIG. 16 is a cross-sectional view illustrating a semiconductor device according to example embodiments.

FIG. 16 is a cross-sectional view illustrating a semiconductor device 14 according to example embodiments. For clarity of illustration, substantially the same structures as those described with reference to FIG. 1 may not be described here.

Referring to FIG. 16, the semiconductor device 14 may be provided. The semiconductor device 14 may include a channel layer 110, a channel supply layer 120, a channel separation pattern 200, a first passivation film 410, a conductive material pattern 300, a second passivation film 420, a source electrode pattern 510, a drain electrode pattern 520, an additional electric-field relaxation film 610, and a first auxiliary drain electrode pattern 700.

Unlike the description given with reference to FIG. 1, a gate electrode pattern 310 may be reversely tapered in a second direction D2. That is, the gate electrode pattern 310 may have a width W310 increasing in the second direction D2. The width W310 of the gate electrode pattern 310 may be a size of the gate electrode pattern 310 in a first direction D1. The width W310 of the gate electrode pattern 310 may increase in a direction toward a bottom surface of an electric-field relaxation pattern 320. The width W310 of the gate electrode pattern 310 may decrease in a direction toward the channel separation pattern 200.

In the present embodiments, the width W310 of the gate electrode pattern 310 may be different from that of the channel separation pattern 200. Therefore, leakage current flowing through lateral surfaces of the gate electrode pattern 310 and the channel separation pattern 200 may be reduced, or it may be possible to limit and/or prevent the leakage current. In the present embodiments, the electric-field relaxation pattern 320 and the additional electric-field relaxation film 610 may reduce or prevent the concentration of an electric field between the gate electrode pattern 310 and the drain electrode pattern 520. According to the present embodiments, the electrical characteristics of the semiconductor device 14 may be improved.

Figure 17:
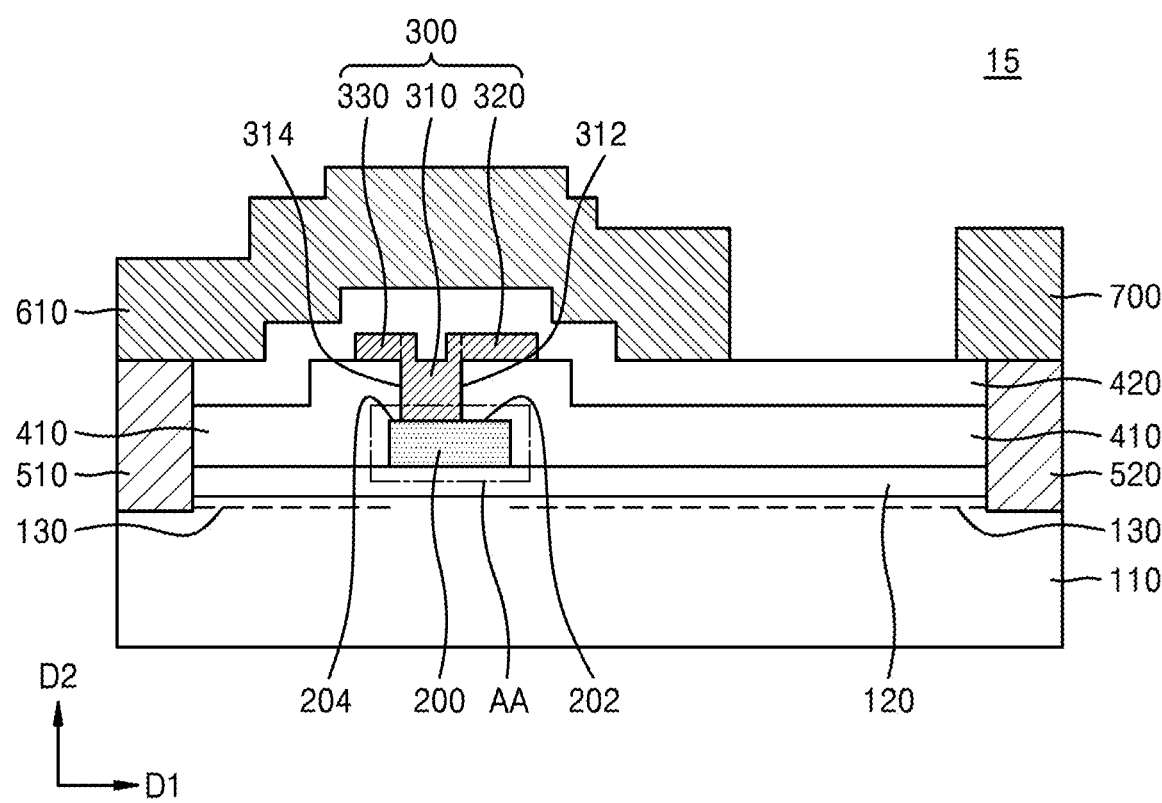
FIG. 17 is a cross-sectional view illustrating a semiconductor device according to example embodiments.
Figure 18:
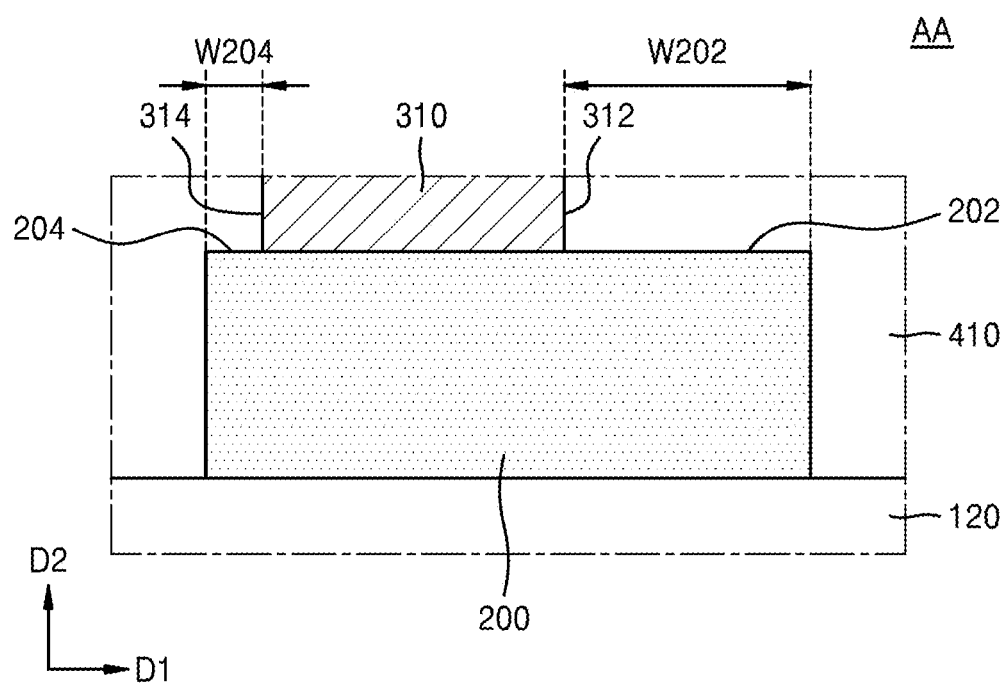
FIG. 18 is an enlarged view illustrating portion AA of FIG. 17.

FIG. 17 is a cross-sectional view illustrating a semiconductor device 15 according to example embodiments. FIG. 18 is an enlarged view illustrating a portion AA of FIG. 17. For clarity of illustration, substantially the same structures as those described with reference to FIG. 1 may not be described here.

Referring to FIGS. 17 and 18, the semiconductor device 15 may be provided. The semiconductor device 15 may include a channel layer 110, a channel supply layer 120, a channel separation pattern 200, a first passivation film 410, a conductive material pattern 300, a second passivation film 420, a source electrode pattern 510, a drain electrode pattern 520, an additional electric-field relaxation film 610, and a first auxiliary drain electrode pattern 700.

The channel separation pattern 200 may include a first upper surface 202 and a second upper surface 204. The first upper surface 202 and the second upper surface 204 may be apart from each other with a gate electrode pattern 310 therebetween. The width W202 of the first upper surface 202 may be different from the width W204 of the second upper surface 204. The width W202 of the first upper surface 202 and the width W204 of the second upper surface 204 may be sizes of the first upper surface 202 and the second upper surface 204 in a first direction D1, respectively. For example, the width W202 of the first upper surface 202 may be greater than the width W204 of the second upper surface 204. However, the relationship between the width W202 of the first upper surface 202 and the width W204 of the second upper surface 204 is not limited thereto. In another example, the width W202 of the first upper surface 202 may be less than the width W204 of the second upper surface 204. The position of the gate electrode pattern 310 on the channel separation pattern 200 may be determined as needed.

In the present embodiments, the gate electrode pattern 310 may be freely arranged on the channel separation pattern 200. In the present embodiments, the gate electrode pattern 310 may have a width different from that of the channel separation pattern 200. Therefore, leakage current flowing through lateral surfaces of the gate electrode pattern 310 and the channel separation pattern 200 may be reduced, or it may be possible to limit and/or prevent the leakage current. In the present embodiments, an electric-field relaxation pattern 320 and the additional electric-field relaxation film 610 may reduce or prevent the concentration of an electric field between the gate electrode pattern 310 and the drain electrode pattern 520. According to the present embodiments, the electrical characteristics of the semiconductor device 15 may be improved.

Figure 19:
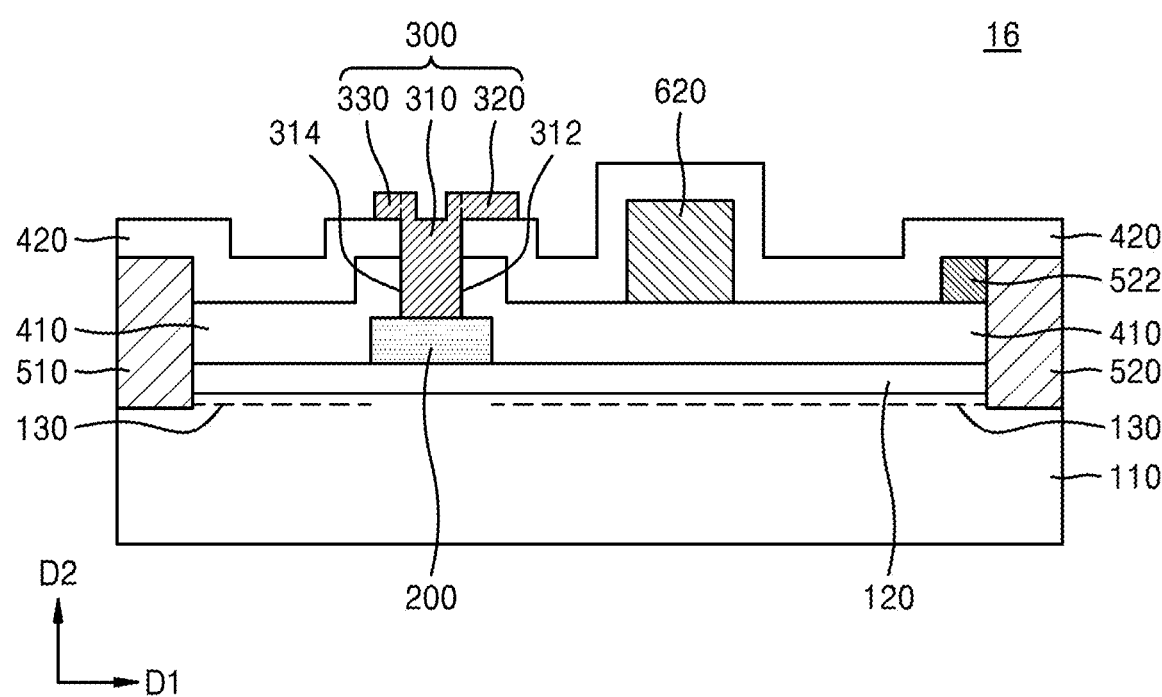
FIG. 19 is a cross-sectional view illustrating a semiconductor device according to example embodiments.

FIG. 19 is a cross-sectional view illustrating a semiconductor device 16 according to example embodiments. For clarity of illustration, substantially the same structures as those described with reference to FIGS. 2 to 8 may not be described here.

Referring to FIG. 19, the semiconductor device 16 may be provided. The semiconductor device 16 may include a channel layer 110, a channel supply layer 120, a channel separation pattern 200, a first passivation film 410, a conductive material pattern 300, a second passivation film 420, and a source electrode pattern 510, a drain electrode pattern 520, a second auxiliary drain electrode pattern 522, and an additional electric-field relaxation pattern 620. The channel layer 110, the channel supply layer 120, the channel separation pattern 200, the first passivation film 410, the second passivation film 420, the source electrode pattern 510, the drain electrode pattern 520, and the second auxiliary drain electrode pattern 522 may be substantially the same as those described with reference to FIG. 8.

The additional electric-field relaxation pattern 620 may be provided between the conductive material pattern 300 and the second auxiliary drain electrode pattern 522. The conductive material pattern 300 and the second auxiliary drain electrode pattern 522 may be apart from each other with the additional electric-field relaxation pattern 620 therebetween. The additional electric-field relaxation pattern 620 may be provided between the first passivation film 410 and the second passivation film 420. For example, a bottom surface of the additional electric-field relaxation pattern 620 may be in direct contact with the first passivation film 410, and lateral surfaces and an upper surface of the additional electric-field relaxation pattern 620 may be in direct contact with the second passivation film 420. The additional electric-field relaxation pattern 620 may include an electrically conductive material. For example, the additional electric-field relaxation pattern 620 may include a metal. When the semiconductor device 16 is operated, voltage may be applied to the additional electric-field relaxation pattern 620. For example, the additional electric-field relaxation pattern 620 may have the same potential as the source electrode pattern 510. However, the additional electric-field relaxation pattern 620 may not be provided in some cases.

In the present embodiments, a gate electrode pattern 310 may have a width different from that of the channel separation pattern 200. Therefore, leakage current flowing through lateral surfaces of the gate electrode pattern 310 and the channel separation pattern 200 may be reduced, or it may be possible to limit and/or prevent the leakage current. In the present embodiments, an electric-field relaxation pattern 320, the additional electric-field relaxation pattern 620, and the second auxiliary drain electrode pattern 522 may reduce or prevent the concentration of an electric field between the gate electrode pattern 310 and the drain electrode pattern 520. According to the present embodiments, the electrical characteristics of the semiconductor device 16 may be improved.

Figure 20:
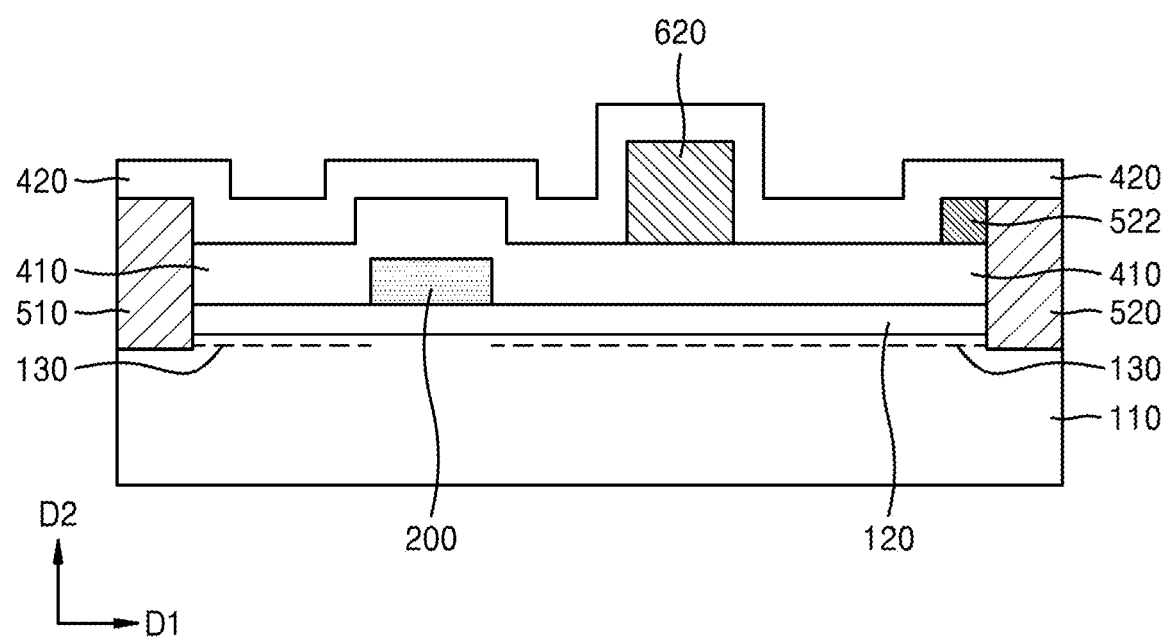
FIG. 20 is a cross-sectional view illustrating a method of fabricating the semiconductor device shown in FIG. 19.
Figure 21:
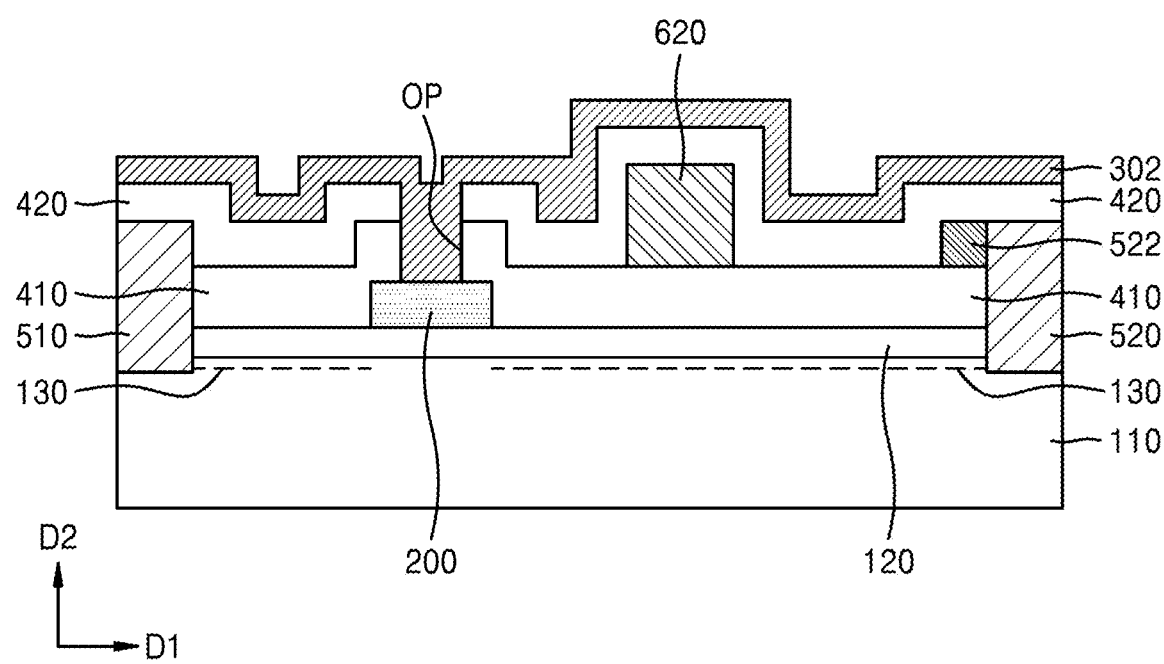
FIG. 21 is a cross-sectional view illustrating the method of fabricating the semiconductor device shown in FIG. 19.

FIG. 20 is a cross-sectional view illustrating a method of fabricating the semiconductor device 16 shown in FIG. 19. FIG. 21 is a cross-sectional view illustrating the method of fabricating the semiconductor device 16 shown in FIG. 19. For clarity of illustration, substantially the same structures as those described with reference to FIGS. 2 to 7, 9, and 10 may not be described here.

Referring to FIG. 20, a channel layer 110, a channel supply layer 120, a channel separation pattern 200, a first passivation film 410, a source electrode pattern 510, a drain electrode pattern 520, an additional electric-field relaxation pattern 620, a second auxiliary drain electrode pattern 522, and a second passivation film 420 may be formed. The forming of the channel layer 110, the channel supply layer 120, the channel separation pattern 200, and the first passivation film 410 may be substantially the same as that described with reference to FIGS. 2 and 3.

The forming of the source electrode pattern 510 and the drain electrode pattern 520 may include performing an etching process to remove the first passivation film 410 and the channel supply layer 120 in two regions which are apart from each other with the channel separation pattern 200 therebetween forming an electrically conductive film (not shown) which fills the two regions and extends along an upper surface of the first passivation film 410 and patterning the electrically conductive film. The electrically conductive film may be formed by depositing an electrically conductive material. For example, the electrically conductive film may be formed through a CVD process, a PVD process, or an ALD process. For example, the electrically conductive film may include a metal. The source electrode pattern 510 and the drain electrode pattern 520 may fill the two regions. A portion of the source electrode pattern 510 and a portion of the drain electrode pattern 520 may protrude in a second direction D2 from the upper surface of the first passivation film 410. During the etching process, upper portions of the channel layer 110 may also be removed. For example, the etching process may be performed up to a position deeper than the depth at which a 2DEG layer 130 is formed in the channel layer 110. Therefore, the source electrode pattern 510 and the drain electrode pattern 520 may be in direct contact with the 2DEG layer 130.

The second auxiliary drain electrode pattern 522 may be formed on a lateral surface of a portion of the drain electrode pattern 520. In an example, the second auxiliary drain electrode pattern 522 may also be formed when the process of forming the source electrode pattern 510 and the drain electrode pattern 520 is performed. For example, when the electrically conductive film is patterned, a portion of the electrically conductive film, which is arranged on the first passivation film 410 at a position immediately adjacent to the drain electrode pattern 520, may not be removed. The portion of the electrically conductive film may be referred to as the second auxiliary drain electrode pattern 522. The second auxiliary drain electrode pattern 522 and the drain electrode pattern 520 may be connected to each other without any interface therebetween. In another example, the second auxiliary drain electrode pattern 522 may be formed through a process different from the process of forming the source electrode pattern 510 and the drain electrode pattern 520. For example, after the source electrode pattern 510 and the drain electrode pattern 520 are formed, the second auxiliary drain electrode pattern 522 may be formed on the first passivation film 410 at a position immediately adjacent to the drain electrode pattern 520. An interface may be formed between the second auxiliary drain electrode pattern 522 and the drain electrode pattern 520.

The additional electric-field relaxation pattern 620 may be formed between the channel separation pattern 200 and the drain electrode pattern 520. The additional electric-field relaxation pattern 620 may be apart from the channel separation pattern 200, the drain electrode pattern 520, and the second auxiliary drain electrode pattern 522. In an example, the additional electric-field relaxation pattern 620 may be formed when the process of forming the source electrode pattern 510 and the drain electrode pattern 520 is performed. For example, when the electrically conductive film is patterned, a portion of the electrically conductive film, which is arranged between the drain electrode pattern 520 and the channel separation pattern 200, may not be removed. The portion of the electrically conductive film may be referred to as the additional electric-field relaxation pattern 620. In another example, the additional electric-field relaxation pattern 620 may be formed through a process different from the process of forming the source electrode pattern 510 and the drain electrode pattern 520. For example, after the source electrode pattern 510 and the drain electrode pattern 520 are formed, the additional electric-field relaxation pattern 620 may be formed between the drain electrode pattern 520 and the channel separation pattern 200.

The second passivation film 420 may be formed on the first passivation film 410, the source electrode pattern 510, the drain electrode pattern 520, and the additional electric-field relaxation pattern 620. A process of forming the second passivation film 420 may include depositing an insulating material on the first passivation film 410, the source electrode pattern 510, the drain electrode pattern 520, and the additional electric-field relaxation pattern 620. For example, the second passivation film 420 may be formed through a CVD process, a PVD process, or an ALD process. For example, the second passivation film 420 may include an oxide, a nitride, or a combination thereof. For example, the second passivation film 420 may include at least one selected from the group consisting of $SiO_2$, $Al_2O_3$, and $Si_xN_y$.

Referring to FIG. 21, an opening OP may be formed in the first and second passivation films 410 and 420. A process of forming the opening OP may include performing an etching process using an etching mask on the first and second passivation films 410 and 420. The etching process may be performed until an upper surface of the channel separation pattern 200 is exposed. In other words, the opening OP may be formed through the first and second passivation films 410 and 420 to expose the upper surface of the channel separation pattern 200. The etching mask may be removed during or after the etching process.

A conductive material film 302 may be formed on the second passivation film 420. The conductive material film 302 may extend along the first passivation film 410. The conductive material film 302 may extend into the opening OP. Although it is illustrated that the conductive material film 302 entirely fills the opening OP, this is a non-limiting example. In another example, the conductive material film 302 may partially fill the opening OP. The conductive material film 302 may be in direct contact with the channel separation pattern 200. A process of forming the conductive material film 302 may include depositing an electrically conductive material on the second passivation film 420. For example, the conductive material film 302 may be formed through a CVD process, a PVD process, or an ALD process. For example, the conductive material film 302 may include a metal.

Referring back to FIG. 19, a conductive material pattern 300 may be formed. The conductive material pattern 300 may be formed by performing an etching process using an etching mask on the conductive material film 302. The conductive material pattern 300 may extend from the inside of the opening OP to the outside of the opening OP. The conductive material pattern 300 may include a gate electrode pattern 310, an electric-field relaxation pattern 320, and a protruding pattern 330. The gate electrode pattern 310, the electric-field relaxation pattern 320, and the protruding pattern 330 may be substantially the same as those described with reference to FIG. 1. Since the gate electrode pattern 310 and the electric-field relaxation pattern 320 are formed at the same time, the time, complexity, and costs of the process of forming the gate electrode pattern 310 and the electric-field relaxation pattern 320 may be reduced compared to the case in which the gate electrode pattern 310 and the electric-field relaxation pattern 320 are formed through separate processes. The etching mask may be removed during or after the etching process.

In the present embodiments, the gate electrode pattern 310 and the electric-field relaxation pattern 320 may be simultaneously formed. Therefore, the time, complexity, and costs of the process of forming the gate electrode pattern 310 and the electric-field relaxation pattern 320 may be reduced compared to the case in which the gate electrode pattern 310 and the electric-field relaxation pattern 320 are formed through separate processes. As a result, a semiconductor device fabricating method which improves process efficiency may be provided.

Figure 22:
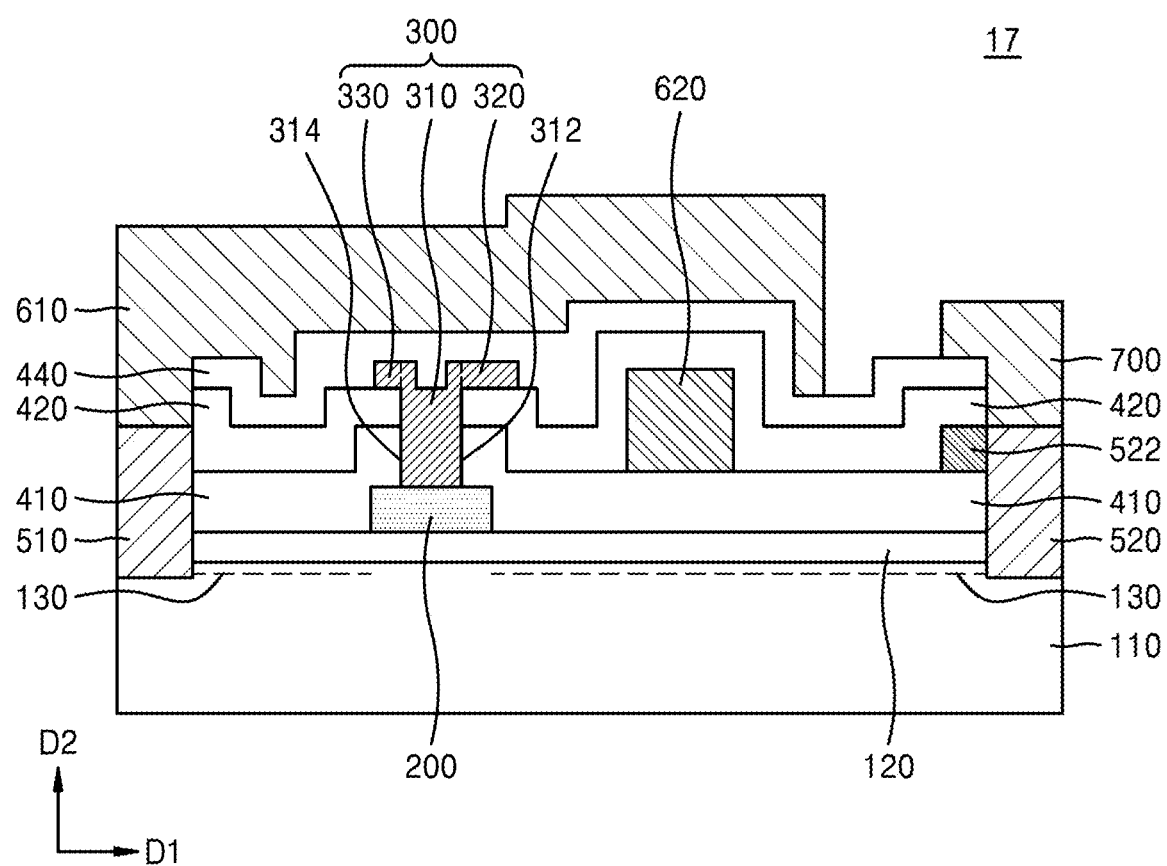
FIG. 22 is a cross-sectional view illustrating a semiconductor device according to example embodiments.

FIG. 22 is a cross-sectional view illustrating a semiconductor device 17 according to example embodiments. For clarity of illustration, substantially the same structures as those described with reference to FIGS. 1 to 19 may not be described here.

Referring to FIG. 22, the semiconductor device 17 may be provided. The semiconductor device 17 may include a channel layer 110, a channel supply layer 120, a channel separation pattern 200, a first passivation film 410, a source electrode pattern 510, a drain electrode pattern 520, a second auxiliary drain electrode pattern 522, an additional electric-field relaxation pattern 620, a second passivation film 420, a conductive material pattern 300, a third passivation film 440, an additional electric-field relaxation film 610, an additional electric-field relaxation pattern 620, and a first auxiliary drain electrode pattern 700. The channel layer 110, the channel supply layer 120, the channel separation pattern 200, the first passivation film 410, the source electrode pattern 510, the drain electrode pattern 520, the second auxiliary drain electrode pattern 522, and the additional electric-field relaxation pattern 620 may be substantially the same as those described with reference to FIG. 19. The third passivation film 440 may be formed on the conductive material pattern 300 and the second passivation film 420. A process of forming the third passivation film 440 may include depositing an insulating material on the conductive material pattern 300 and the second passivation film 420. For example, the third passivation film 440 may be formed through a CVD process, a PVD process, or an ALD process. For example, the third passivation film 440 may include an oxide, a nitride, or a combination thereof. For example, the third passivation film 440 may include at least one selected from the group consisting of $SiO_2$, $Al_2O_3$, and $Si_xN_y$.

The third passivation film 440 and the second passivation film 420 may expose the source electrode pattern 510 and the drain electrode pattern 520. For example, after the second and third passivation films 420 and 440 are formed to cover the source electrode pattern 510 and the drain electrode pattern 520, portions of the second and third passivation films 420 and 440, which are on the source electrode pattern 510 and the drain electrode pattern 520, may be removed through an etching process using an etching mask. The additional electric-field relaxation film 610 may be provided on the third passivation film 440. The additional electric-field relaxation film 610 may overlap the source electrode pattern 510, the conductive material pattern 300, and the additional electric-field relaxation pattern 620 in a second direction D2. The additional electric-field relaxation film 610 may extend onto the source electrode pattern 510. The additional electric-field relaxation film 610 may be electrically connected to the source electrode pattern 510. For example, the additional electric-field relaxation film 610 may be in direct contact with the source electrode pattern 510.

The first auxiliary drain electrode pattern 700 may be provided on the third passivation film 440. The first auxiliary drain electrode pattern 700 may be apart from the additional electric-field relaxation film 610. For example, the third passivation film 440 may be exposed between the first auxiliary drain electrode pattern 700 and the additional electric-field relaxation film 610. The first auxiliary drain electrode pattern 700 may overlap the drain electrode pattern 520 and the second auxiliary drain electrode pattern 522 in the second direction D2. The first auxiliary drain electrode pattern 700 may extend onto the drain electrode pattern 520. The first auxiliary drain electrode pattern 700 may be electrically connected to the drain electrode pattern 520. For example, the first auxiliary drain electrode pattern 700 may be in direct contact with the drain electrode pattern 520.

Figure 26:
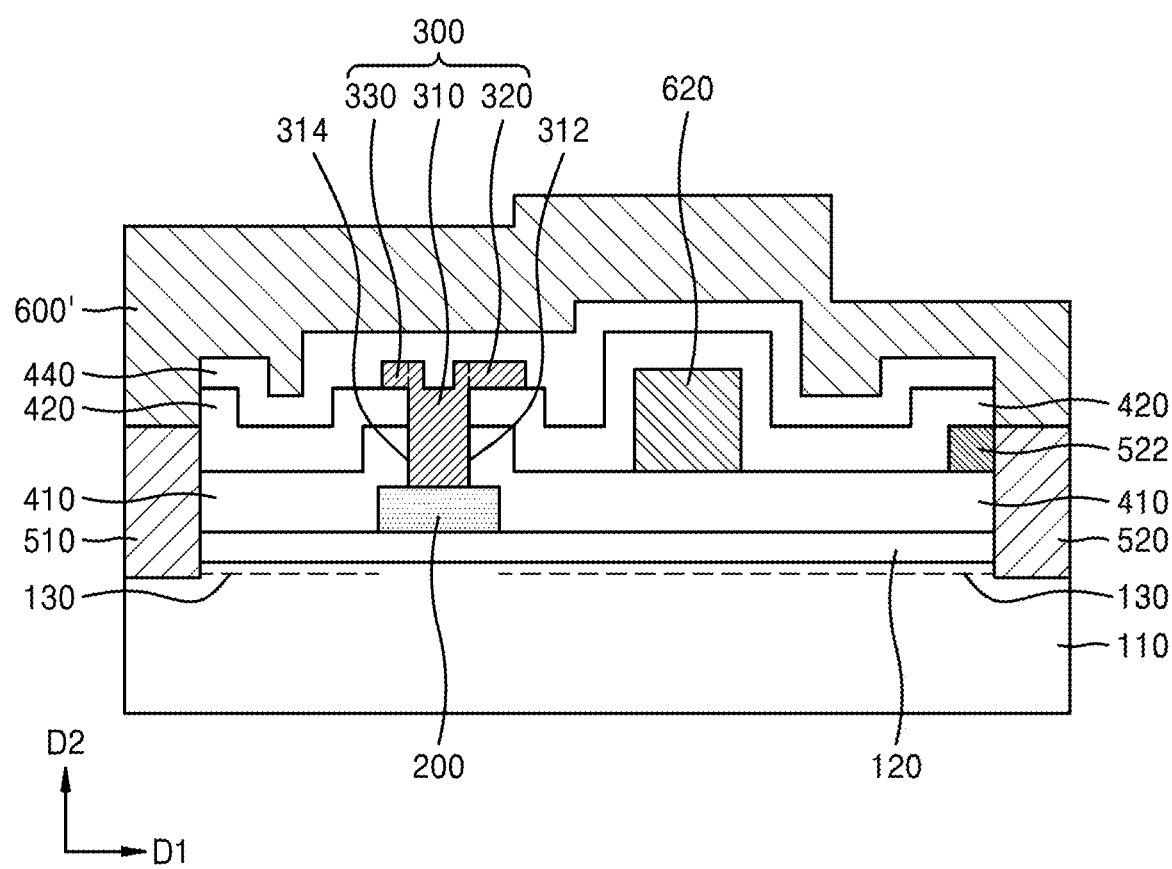
FIG. 26 is a cross-sectional view illustrating an operation of a method of fabricating the semiconductor device shown in FIG. 22 according to example embodiments.

In some embodiments, as depicted in FIG. 26, the additional electric-field relaxation film 610 and drain electrode pattern 700 of FIG. 22 may be formed by forming a preliminary additional electric-field relaxation film 600', which extends from the source electrode pattern 510 to the drain electrode pattern 520 along an upper surface of the third passivation film 440; and patterning the preliminary additional electric-field relaxation film 600' to expose the upper surface of the third passivation film 440 between the conductive material pattern 300 and the drain electrode pattern 520.

In the present embodiments, a gate electrode pattern 310 may have a width different from that of the channel separation pattern 200. Therefore, leakage current flowing through lateral surfaces of the gate electrode pattern 310 and the channel separation pattern 200 may be reduced, or it may be possible to limit and/or prevent the leakage current. In the present embodiments, the electric-field relaxation pattern 320, the additional electric-field relaxation pattern 620, the second auxiliary drain electrode pattern 522, the additional electric-field relaxation film 610, and the first auxiliary drain electrode pattern 700 may reduce or prevent the concentration of an electric field between the gate electrode pattern 310 and the drain electrode pattern 520. According to the present embodiments, the electrical characteristics of the semiconductor device 17 may be improved.

Figure 23:
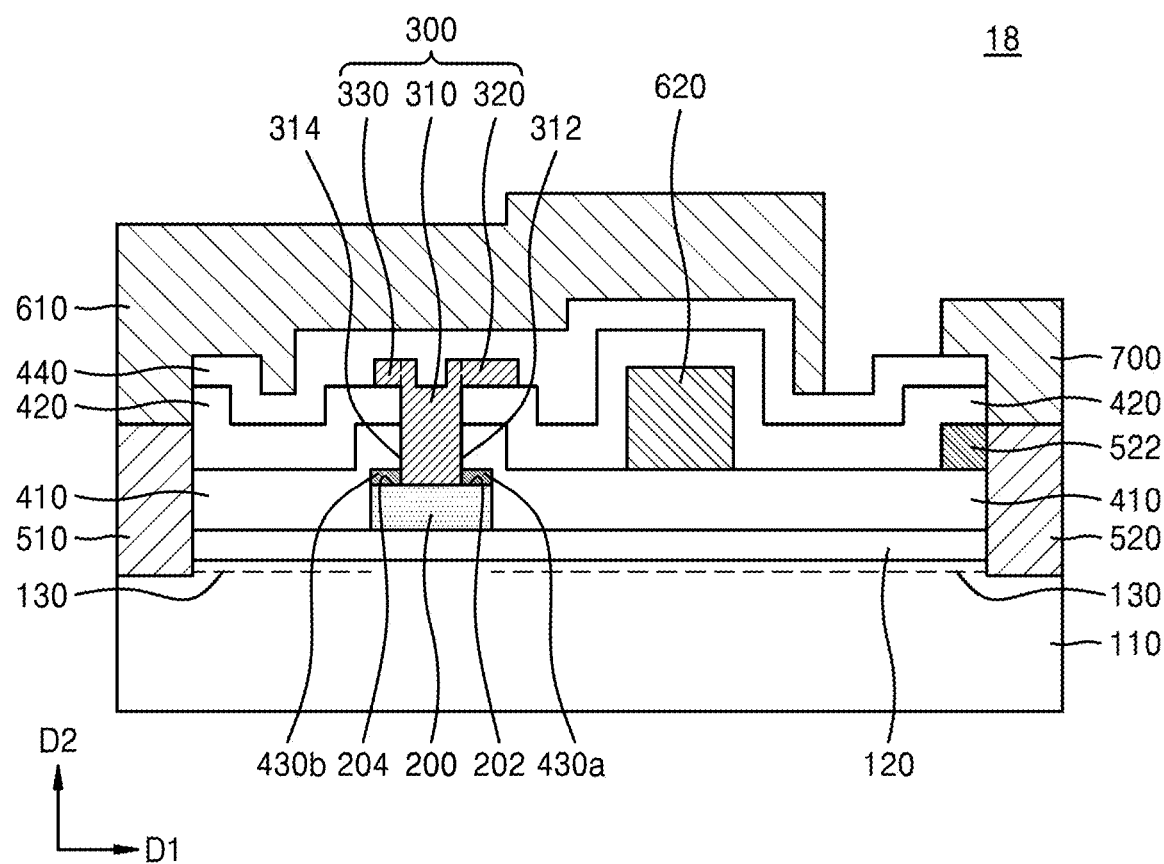
FIG. 23 is a cross-sectional view illustrating a semiconductor device according to example embodiments.

FIG. 23 is a cross-sectional view illustrating a semiconductor device 18 according to example embodiments. For clarity of illustration, substantially the same contents as those described with reference to FIG. 22 may not be described here.

Referring to FIG. 23, the semiconductor device 18 may be provided. The semiconductor device 18 may include a channel layer 110, a channel supply layer 120, a channel separation pattern 200, a first passivation pattern 430a, a second passivation pattern 430b, a first passivation film 410, a source electrode pattern 510, a drain electrode pattern 520, a second auxiliary drain electrode pattern 522, an additional electric-field relaxation pattern 620, a second passivation film 420, a conductive material pattern 300, a third passivation film 440, an additional electric-field relaxation film 610, and a first auxiliary drain electrode pattern 700. The channel layer 110, the channel supply layer 120, the channel separation pattern 200, the first passivation film 410, the second passivation film 420, the source electrode pattern 510, the drain electrode pattern 520, the second auxiliary drain electrode pattern 522, the additional electric-field relaxation pattern 620, the third passivation film 440, the additional electric-field relaxation film 610, and the first auxiliary drain electrode pattern 700 may be substantially the same as those described with reference to FIG. 22.

The first passivation pattern 430a and the second passivation pattern 430b may be substantially the same as those described with reference to FIG. 12.

Unlike the semiconductor device 17 described with reference to FIG. 22, the semiconductor device 18 may further include the first and second passivation patterns 430a and 430b. The first passivation pattern 430a and the second passivation pattern 430b may be provided among the first passivation film 410, the channel separation pattern 200, and a gate electrode pattern 310. The first passivation pattern 430a and the second passivation pattern 430b are respectively provided on a first upper surface 202 and a second upper surface 204 of the channel separation pattern 200 which are exposed by the gate electrode pattern 310. The first upper surface 202 and the second upper surface 204 of the channel separation pattern 200 may be respectively exposed at a first lateral surface 312 and a second lateral surface 314 of the gate electrode pattern 310. The first passivation pattern 430a and the second passivation pattern 430b may be in direct contact with first lateral surface 312 and the second lateral surface 314 of the gate electrode pattern 310, respectively. A lateral surface of the first passivation pattern 430a and a lateral surface of the channel separation pattern 200 immediately adjacent to the lateral surface of the first passivation pattern 430a may be coplanar. A lateral surface of the second passivation pattern 430b and another lateral surface of the channel separation pattern 200 immediately adjacent to the lateral surface of the second passivation pattern 430b may be coplanar. The first passivation pattern 430a and the second passivation pattern 430b may have a high etch selectivity with respect to the channel separation pattern 200. For example, the first passivation pattern 430a and the second passivation pattern 430b may have an etch selectivity of greater than about 1 with respect to the channel separation pattern 200. The first passivation pattern 430a and the second passivation pattern 430b may have a low etch selectivity with respect to the first passivation film 410. For example, the first passivation pattern 430a and the second passivation pattern 430b may have an etch selectivity of less than about 1 with respect to the first passivation film 410. For example, the first passivation pattern 430a and the second passivation pattern 430b may include an oxide. For example, the first passivation pattern 430a and the second passivation pattern 430b may include $SiO_2$.

In the present embodiments, the gate electrode pattern 310 may have a width different from that of the channel separation pattern 200. Therefore, leakage current flowing through lateral surfaces of the gate electrode pattern 310 and the channel separation pattern 200 may be reduced, or it may be possible to limit and/or prevent the leakage current. In the present embodiments, an electric-field relaxation pattern 320 may reduce or prevent the concentration of an electric field between the gate electrode pattern 310 and the drain electrode pattern 520. According to the present embodiments, the electrical characteristics of the semiconductor device 18 may be improved.

According to the present embodiments, conditions for the etch selectivity of the first passivation film 410 with respect to the channel separation pattern 200 may be eased or removed. Therefore, the range of materials that may be used as the first passivation film 410 may be widened. As a result, the electrical characteristics of the semiconductor device 18 may be improved.

As described above, the present disclosure may provide semiconductor devices having improved electrical characteristics.

In addition, the present disclosure may provide methods of fabricating semiconductor devices having improved electrical characteristics.

In addition, the present disclosure may provide methods of fabricating semiconductor devices with high process efficiency.

The above-described semiconductor devices may be applicable to various types of high power devices and electronic devices including the same.

Figure 27:
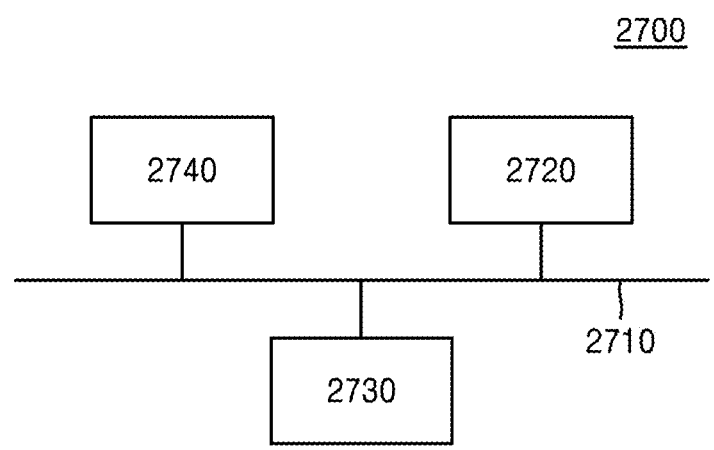
FIG. 27 is a schematic view of an electronic device according to example embodiments.

FIG. 27 is a schematic of an electronic device according to example embodiments.

As shown in FIG. 27, the electronic device 2700 includes one or more electronic device components, including a processor (e.g., processing circuitry) 2720 and a memory 2730 that are communicatively coupled together via a bus 2710.

The processing circuitry 2720 may be included in, may include, and/or may be implemented by one or more instances of processing circuitry such as hardware including logic circuits, a hardware/software combination such as a processor executing software; or a combination thereof. For example, the processing circuitry 2720 may include, but is not limited to, a central processing unit (CPU), an application processor (AP), an arithmetic logic unit (ALU), a graphic processing unit (GPU), a digital signal processor, a microcomputer, a field programmable gate array (FPGA), a System-on-Chip (SoC) a programmable logic unit, a microprocessor, or an application-specific integrated circuit (ASIC), etc. In some example embodiments, the memory 2730 may include a non-transitory computer readable storage device, for example a solid state drive (SSD), storing a program of instructions, and the processing circuitry 2720 may be configured to execute the program of instructions to implement the functionality of the electronic device 2700.

In some example embodiments, the electronic device 2700 may include one or more additional components 2740, coupled to bus 2710, which may include, for example, a power supply, a light sensor, a light-emitting device, any combination thereof, or the like. In some example embodiments, one or more of the processing circuitry 2720, memory 2730, or one or more additional components 2740 may include any device according to any of the example embodiments described herein, such as the semiconductor devices in FIGS. 1, 8, 15-19, and 22-23, such that the one or more of the processing circuitry 2720, memory 2730, or one or more additional components 2740, and thus, the electronic device 2700, may have a power device having improved electrical characteristics and thus improved performance and/or reliability.

However, effects of the present disclosure are not limited thereto.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:
1. A semiconductor device comprising:
a channel layer including a channel;
a channel supply layer on the channel layer, an interface between the channel supply layer and the channel layer being adjacent to the channel;
a channel separation pattern on the channel supply layer;
a gate electrode pattern on the channel separation pattern, a size of the gate electrode pattern in a first direction being different from a size of the channel separation pattern in the first direction, the first direction being parallel with an upper surface of the channel layer;
an electric-field relaxation pattern protruding from a first lateral surface of the gate electrode pattern in the first direction;
a first passivation film between the electric-field relaxation pattern and the channel supply layer;
a first passivation pattern between the first passivation film and the channel separation pattern, the first passivation pattern on the first lateral surface of the gate electrode pattern; and
a second passivation pattern between the first passivation film and the channel separation pattern, the second passivation pattern on a second lateral surface of the gate electrode pattern, wherein
the electric-field relaxation pattern and gate electrode pattern forming a single structure, a lateral surface of the first passivation pattern and a lateral surface of the channel separation pattern are coplanar and immediately adjacent to each other, and a lateral surface of the second passivation pattern and an other lateral surface of the channel separation pattern are coplanar and immediately adjacent to each other.

2. The semiconductor device of claim 1, wherein
the size of the gate electrode pattern in the first direction is less than the size of the channel separation pattern in the first direction.

3. The semiconductor device of claim 2, wherein
the gate electrode pattern exposes a first upper surface of the channel separation pattern, and
the first upper surface of the channel separation pattern faces a bottom surface of the electric-field relaxation pattern.

4. The semiconductor device of claim 3, wherein
a size of the bottom surface of the electric-field relaxation pattern in the first direction is greater than a size of the first upper surface of the channel separation pattern in the first direction.

5. The semiconductor device of claim 3, wherein
the gate electrode pattern exposes a second upper surface of the channel separation pattern,
the first upper surface and the second upper surface of the channel separation pattern are apart from each other in the first direction, and
a size of the first upper surface of the channel separation pattern in the first direction is different from a size of the second upper surface of the channel separation pattern in the first direction.

6. The semiconductor device of claim 1, wherein
the channel separation pattern is between the first passivation film and the channel supply layer, and
the gate electrode pattern passes through the first passivation film and is in direct contact with the channel separation pattern.

7. The semiconductor device of claim 6, wherein
an insulating material of the first passivation film is different than an insulating material of the first passivation pattern.

8. The semiconductor device of claim 7, wherein
the first passivation film includes a nitride, and
the first passivation pattern includes an oxide.

9. The semiconductor device of claim 8,
wherein the second lateral surface of the gate electrode pattern is opposite the first lateral surface of the gate electrode pattern.

10. The semiconductor device of claim 6, further comprising:
a drain electrode pattern on the channel layer and apart from the gate electrode pattern in the first direction;
a source electrode pattern at a side of the gate electrode pattern, the side of the gate electrode pattern being opposite the drain electrode pattern; and
a second auxiliary drain electrode pattern protruding from a lateral surface of the drain electrode pattern,
wherein the second auxiliary drain electrode pattern is on the first passivation film.

11. The semiconductor device of claim 10, further comprising:
a second passivation film between the first passivation film and the electric-field relaxation pattern; and
an additional electric-field relaxation pattern between the second passivation film and the first passivation film, wherein the additional electric-field relaxation pattern is between the gate electrode pattern and the second auxiliary drain electrode pattern,
the gate electrode pattern passes through the second passivation film and the first passivation film, and
the gate electrode pattern directly contacts the channel separation pattern.

12. A semiconductor device comprising:
a channel layer including a channel;
a channel supply layer on the channel layer, an interface between the channel supply layer and the channel layer being adjacent to the channel;
a channel separation pattern on the channel supply layer;
a gate electrode pattern on the channel separation pattern, a size of the gate electrode pattern in a first direction being different from a size of the channel separation pattern in the first direction, the first direction being parallel with an upper surface of the channel layer;
an electric-field relaxation pattern protruding from a first lateral surface of the gate electrode pattern in the first direction, the electric-field relaxation pattern and gate electrode pattern forming a single structure;
a first passivation film between the electric-field relaxation pattern and the channel supply layer;
a second passivation film between the first passivation film and the electric-field relaxation pattern;
a drain electrode pattern on the channel layer and apart from the gate electrode pattern in the first direction;
a source electrode pattern at a side of the gate electrode pattern, the side of the gate electrode pattern being opposite the drain electrode pattern;
a third passivation film on the gate electrode pattern, the electric-field relaxation pattern, and the second passivation film;
an additional electric-field relaxation film on the third passivation film; and
a first auxiliary drain electrode pattern on the third passivation film;
a second auxiliary drain electrode pattern protruding from a lateral surface of the drain electrode pattern; and
an additional electric-field relaxation pattern between the second passivation film and the first passivation film, wherein
the second auxiliary drain electrode pattern is on the first passivation film,
the additional electric-field relaxation film is electrically connected to the source electrode pattern,
the first auxiliary drain electrode pattern is electrically connected to the drain electrode pattern, and
the additional electric-field relaxation film and the first auxiliary drain electrode pattern are apart from each other.

13. The semiconductor device of claim 12, further comprising:
a first passivation pattern between the first passivation film and the channel separation pattern; and
a second passivation pattern on a side of the gate electrode pattern, the side of the gate electrode pattern being opposite the first passivation pattern,
wherein the first passivation film and the first passivation pattern comprise different insulating materials from each other, respectively, and
the first passivation pattern and the second passivation pattern include a same material.

14. The semiconductor device of claim 13, wherein
the first passivation film includes a nitride, and the first passivation pattern and the second passivation pattern includes an oxide.

15. The semiconductor device of claim 6, further comprising:
a second passivation film on the first passivation film and the gate electrode pattern;
a drain electrode pattern apart from the gate electrode pattern in the first direction;
a source electrode pattern at a side of the gate electrode pattern, the side of the gate electrode pattern being opposite the drain electrode pattern;
an additional electric-field relaxation film on the second passivation film; and
a first auxiliary drain electrode pattern on the drain electrode pattern, wherein
the electric-field relaxation pattern is between the second passivation film and the first passivation film,
the additional electric-field relaxation film overlaps the source electrode pattern in a second direction perpendicular to the upper surface of the channel layer,
the additional electric-field relaxation film is electrically connected to the source electrode pattern, and
the first auxiliary drain electrode pattern is electrically connected to the drain electrode pattern.

16. The semiconductor device of claim 1, further comprising:
a protruding pattern that protrudes from a second lateral surface of the gate electrode pattern, the second lateral surface of the gate electrode pattern being opposite the first lateral surface of the gate electrode pattern,
wherein the protruding pattern and the gate electrode pattern form a single structure.

17. The semiconductor device of claim 16, wherein a size of the electric-field relaxation pattern in the first direction is greater than a size of the protruding pattern in the first direction.

18. The semiconductor device of claim 1, wherein the size of the channel separation pattern in the first direction decreases in a direction away from the channel supply layer.

19. The semiconductor device of claim 1, wherein the size of the gate electrode pattern in the first direction increases in a direction away from the channel supply layer.

20. The semiconductor device of claim 1, further comprising:
a drain electrode pattern being apart from the gate electrode pattern in the first direction; and
a source electrode pattern at a side of the gate electrode pattern, the side of the gate electrode pattern being opposite the drain electrode pattern,
wherein the source electrode pattern and the drain electrode pattern pass through the first passivation film and the channel supply layer, and
the source electrode pattern and the drain electrode pattern contact the channel.

21. The semiconductor device of claim 1, wherein
the channel layer includes GaN,
the channel separation pattern includes a group III-V nitride semiconductor, and
the channel supply layer includes a nitride including at least of aluminum (Al), gallium (Ga), indium (In), and boron (B).

22. The semiconductor device of claim 21, wherein
the channel separation pattern is p-type and includes at least one of GaN, AlGaN, InN, AlInN, InGaN, and AlInGaN, and
the channel supply layer includes at least one of AlGaN, AlInN, InGaN, AlN, and AlInGaN.

23. A semiconductor device comprising:
a semiconductor layer, the semiconductor layer including a 2-dimensional electron gas (2DEG) layer, the 2DEG layer including a depletion region;
a p-type semiconductor pattern on the semiconductor layer and over the depletion region;
a conductive material pattern on the p-type semiconductor pattern,
a width of a lower portion of the conductive material pattern being different from a width of the p-type semiconductor pattern,
a width of an upper portion of the conductive material pattern being greater than the width of the lower portion of the conductive material pattern;
a first passivation film between the conductive material pattern and the semiconductor layer;
a first passivation pattern between the first passivation film and the p-type semiconductor pattern, the first passivation pattern on a lateral surface of a portion the conductive material pattern;
a second passivation pattern, the second passivation pattern between the first passivation film and the p-type semiconductor pattern, the second passivation pattern on a lateral surface of the portion of the conductive material pattern; and
a source electrode pattern and a drain electrode pattern on the semiconductor layer, the source electrode pattern and the drain electrode pattern apart from each other in a direction parallel with an upper surface of the semiconductor layer with the conductive material pattern therebetween, wherein
a lateral surface of the first passivation pattern and a lateral surface of the p-type semiconductor pattern are coplanar and immediately adjacent to each other, and
a lateral surface of the second passivation pattern and an other lateral surface of the p-type semiconductor pattern are coplanar and immediately adjacent to each other.

24. The semiconductor device of claim 23, wherein the width of the lower portion of the conductive material pattern is less than the width of the p-type semiconductor pattern.

25. The semiconductor device of claim 23, wherein a distance between the upper portion of the conductive material pattern and the drain electrode pattern is less than a distance between the lower portion of the conductive material pattern and the drain electrode pattern.

26. The semiconductor device of claim 23, wherein a distance between the upper portion of the conductive material pattern and the drain electrode pattern is less than a distance between the p-type semiconductor pattern and the drain electrode pattern.

27. The semiconductor device of claim 23, wherein the width of the upper portion of the conductive material pattern is greater than the width of the p-type semiconductor pattern.

28. The semiconductor device of claim 23, further comprising:
an additional electric-field relaxation film on the conductive material pattern,
wherein a distance between the additional electric-field relaxation film and the drain electrode pattern is less than a distance between the upper portion of the conductive material pattern and the drain electrode pattern.

29. The semiconductor device of claim 23, further comprising:

an auxiliary drain electrode pattern protruding from a lateral surface of the drain electrode pattern toward the conductive material pattern; and an additional electric-field relaxation pattern between the conductive material pattern and the auxiliary drain electrode pattern.

30. The semiconductor device of claim 23, wherein a distance between the upper portion of the conductive material pattern and the source electrode pattern is less than a distance between the lower portion of the conductive material pattern and the source electrode pattern.

31. The semiconductor device of claim 30, wherein the upper portion of the conductive material pattern includes an electric-field relaxation pattern and a protruding pattern, the electric-field relaxation pattern protrudes from a first lateral surface of the upper portion of the conductive material pattern toward the drain electrode pattern, the protruding pattern protrudes from a second lateral surface of the upper portion of the conductive material pattern toward the source electrode pattern, and a width of the electric-field relaxation pattern is greater than a width of the protruding pattern.

32. The semiconductor device of claim 23, further comprising:

a first passivation pattern on a first upper surface of the p-type semiconductor pattern; and a second passivation pattern on a second upper surface of the p-type semiconductor pattern, wherein the conductive material pattern exposes the first upper surface of the p-type semiconductor pattern and the second upper surface of the p-type semiconductor pattern, and the first passivation pattern and the second passivation pattern are apart from each other with the conductive material pattern therebetween.

33. The semiconductor device of claim 23, wherein the semiconductor layer includes GaN, and the p-type semiconductor pattern includes a group III-V nitride semiconductor.

34. The semiconductor device of claim 1, further comprising:

a drain electrode pattern apart from the gate electrode pattern in the first direction; and a source electrode pattern spaced apart from the gate electrode pattern in the first direction opposite the drain electrode pattern, wherein a minimum distance in the first direction between the gate electrode pattern and the drain electrode pattern is less than a minimum distance in the first direction between the source electrode pattern and the drain electrode pattern.

35. The semiconductor device of claim 12, wherein the channel separation pattern is between the first passivation film and the channel supply layer, the gate electrode pattern passes through the first passivation film and is in direct contact with the channel separation pattern, the additional electric-field relaxation pattern is between the gate electrode pattern and the second auxiliary drain electrode pattern, the gate electrode pattern passes through the second passivation film and the first passivation film, and the gate electrode pattern directly contacts the channel separation pattern.

* * * * *